United States Patent [19]

Marks

[11] Patent Number: 4,798,959
[45] Date of Patent: Jan. 17, 1989

[54] SUPER SUBMICRON ELECTRON BEAM WRITER

[76] Inventor: Alvin M. Marks, Bigelow Rd., Athol, Mass. 01331

[21] Appl. No.: 1,330

[22] Filed: Jan. 2, 1987

[51] Int. Cl.[4] ............................................. H01J 37/30
[52] U.S. Cl. ................................. 250/492.2; 250/398
[58] Field of Search ........... 250/492.2, 492.22, 492.21, 250/398

[56] References Cited

U.S. PATENT DOCUMENTS

| | | | |
|---|---|---|---|
| 3,875,416 | 4/1975 | Spicer | 250/492.22 |
| 4,151,420 | 4/1979 | Keller et al. | 250/492.21 |
| 4,298,803 | 11/1981 | Matsuura | 250/492.22 |
| 4,418,283 | 11/1983 | Trotel | 250/492.2 |

OTHER PUBLICATIONS

Nanometrics, "Nanoletter", vol. 2, No. 2, May 1983.

Primary Examiner—Bruce C. Anderson
Assistant Examiner—Jack I. Berman

[57] ABSTRACT

A demagnified image of an array of electron emitters is focused by an electron optics lens onto a substrate. The image of the array is scanned to draw a number of patterns, corresponding to the number of emitters, on the substrate. The image is also moved in a step - and - repeat manner to draw patterns over a larger portion of the substrate than can be covered by one emitter array image.

16 Claims, 16 Drawing Sheets

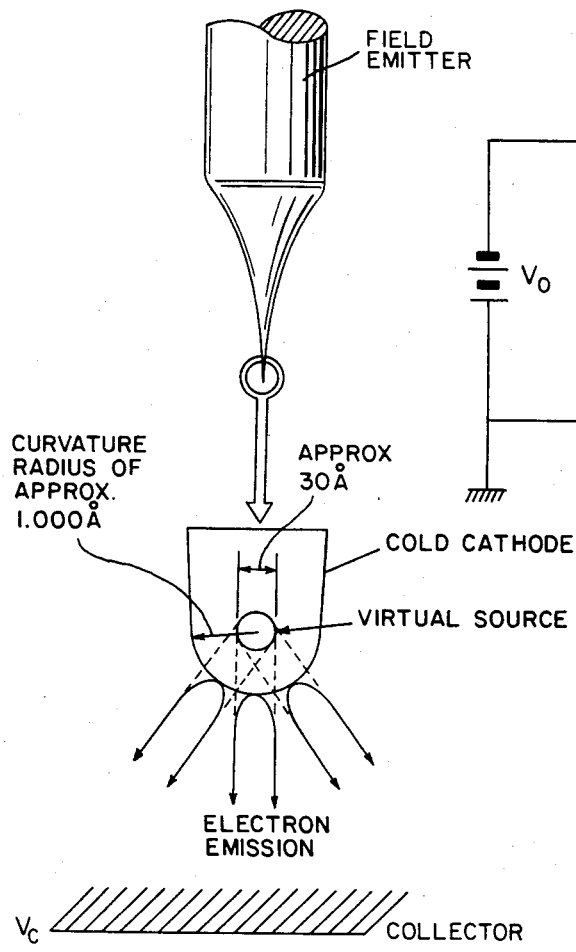
FIG. 1 PRIOR ART
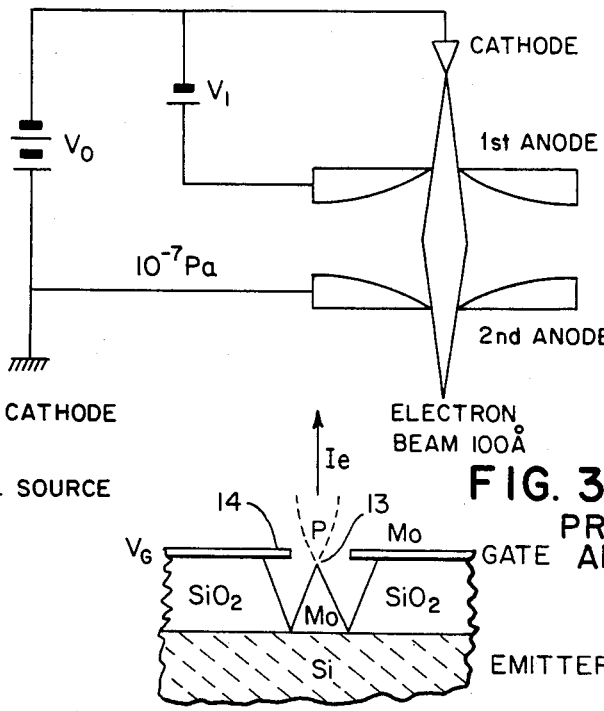
FIG. 2 PRIOR ART
FIG. 3 PRIOR ART
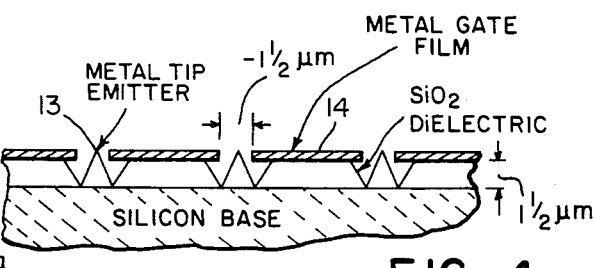
FIG. 4 PRIOR ART
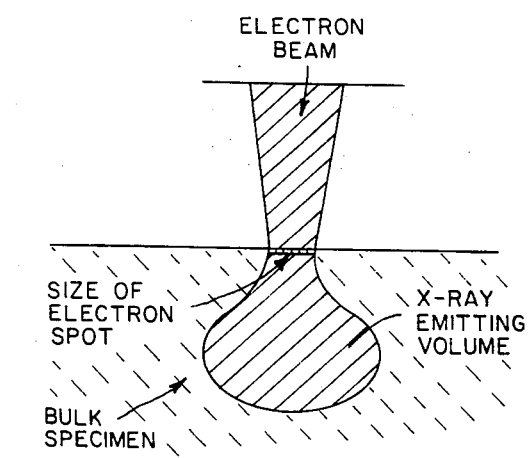
FIG. 9 PRIOR ART
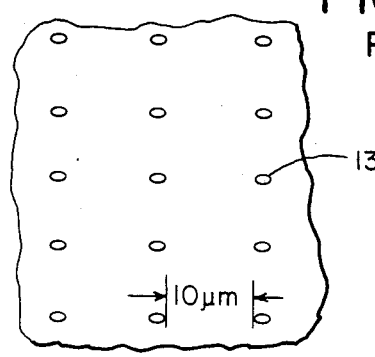
FIG. 5 PRIOR ART

PROCESS A

PROCESS B

ION COATER

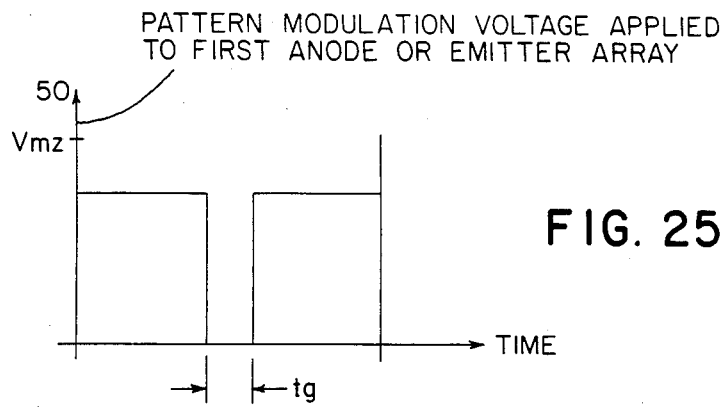
FIG. 25 PATTERN MODULATION VOLTAGE APPLIED TO FIRST ANODE OR EMITTER ARRAY
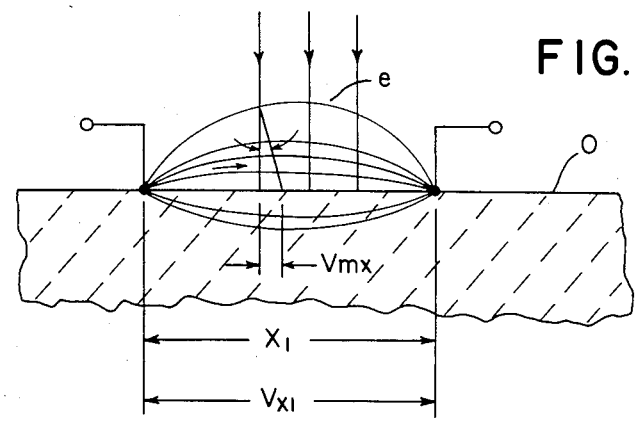
FIG. 26
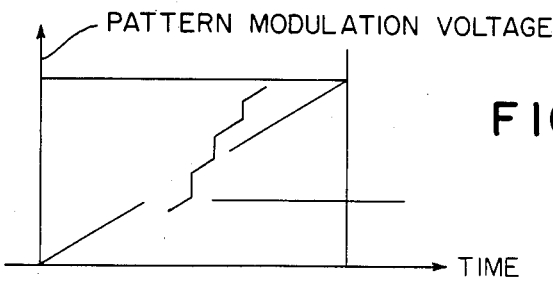
FIG. 27 PATTERN MODULATION VOLTAGE
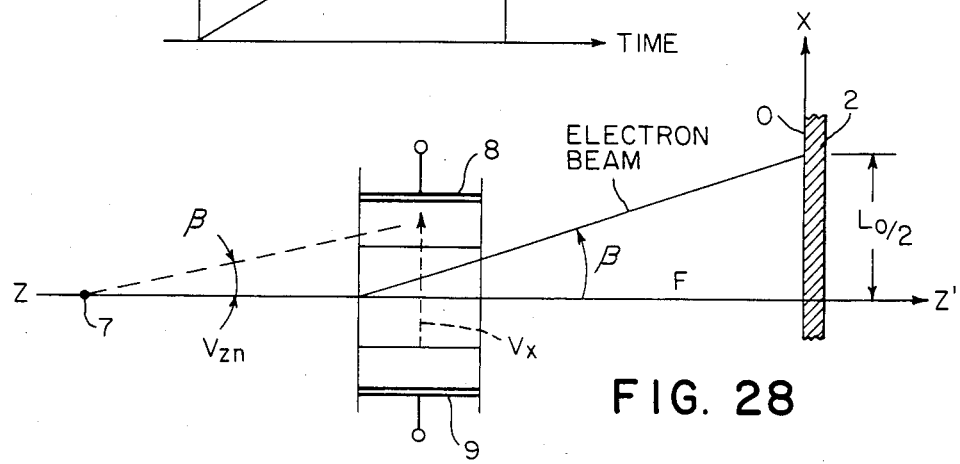
FIG. 28

SUPER SUBMICRON ELECTRON BEAM WRITER

FIELD OF THE INVENTION

This invention relates to a novel manufacturing device and method for the high speed production (about 0.1 m²/sec.) of a plurality of submicron circuits deposited onto a large area (1 m²) sheets.

DEFINITIONS

ELCON TM A trademark for a submicron array of dipole antennae on a sheet which emits light photon power by transducing the equivalent input electrical power from a direct electric current input; thus directly converting input electric power per unit area to output light power per unit area (watts/m²). The light is emitted from the sheet as a parallel laser beam of a particular color or frequency with its electric vector parallel to the long axis of the antenna.

LEPCON TM A trademark for a submicron array of dipole antennae capable of receiving and transducing light photon energy $\Sigma=h\nu$ into its equivalent electron energy $\Sigma=Ve$ as direct current; thus directly converting light power per unit area (photons/sec-m²) to electric power per unit area (watts/m²). Randomly polarized light photons are resolved. Two orthogonal antennae arrays totally absorb and transduce the randomly oriented incident photons. In bright sunlight the electric power output is about 500 watts at 80% efficiency.

SUPERSEBTER TM An acronym for Super Submicron Electron Beam Writer for the rapid fabrication of submicron arrays for LEPCON TM or ELCON TM devices, or other submicron circuits.

RELATED PATENTS AND APPLICATIONS

There is no earlier patent or patent application on this subject. The present invention resulted from the need for the high speed low cost manufacture of submicron devices such as described in U.S. Pat. No. 4,445,050 entitled "Device for the Conversion of Light Power to Electric Power" issued Apr. 24, 1984 to Alvin M. Marks, and U.S. Pat. No. 4,720,642 entitled "Femto Diode and Applications" issued Jan. 19, 1988 to the same inventor. The latter discloses an improved LEPCON TM light-electric power converter, an ELECON TM electric-light power converter or laser, and other devices including 2D and 3D displays, high-speed compact supercomputers, etc.

BACKGROUND OF THE INVENTION

The State of the Art of "Nanometer-Scale Fabrication" has been given with an excellent bibliography, as of 1982 [1]; wherein, it is stated on p.3:

"... electron, ion and X-ray exposure, ... limitations of the resist ... not those of the exposure system ... set the ultimate limit on ... resolution"; and: "The most commonly used resist for high resolution (<100 nm or 1000 A) is (PMMA) polymethylmethacrylate. A resolution of <50 nm. or 500 A may be obtained with other resists ... not well studied. "; and: "exposure of PMMA with a high intensity 50 kV field-emission electron beam source with a 20 nm. beam of $10^{-7}$ amps ... takes 1 day (86,400 sec.) to expose a dense pattern on a 4" square (100 cm.² or $10^{-2}$ m²), with additional time for stage motion and alignment."

This is a speed of about $10^{-7}$ m²/sec; and a resolution of only 500 A.

The use of reactive ion etching to produce localized probes 1000 A apart is reported [2] but this resolution is also not small enough, and there is no increase in speed.

For the manufacture of Lepcon TM, Elcon TM and such devices this speed is too small; and the resolution not small enough. A speed of about 0.1 m²/sec and a resolution of 10 A is required, not obtainable with these prior art devices.

A 10 A resolution is reported [3]:

"Using a ½ nm (5 A) diam beam of 100 keV electron, we have etched lines, holes and patterns in NaCl crystals at the 2 nm. (20 A) scale size. Troughs about 1.5 nm. wide on 4.5 nm centers and 2 nm dia holes have been etched completely through NaCl crystals more the 30 nm thick." and "The scanning transmission electron microscope (VG Microscopes, Ltd., Model HB5) in operation in the National Research and Resource Facility for Submicron Structures at Cornell University can produce up to 1 nA of 100 keV electrons in a beam dia as small as ½ nm (5 A). This beam current density of $\frac{1}{2}\times 10^6$ A/cm² means that it takes only 10 μs to deposit a dose of 5 coulombs/cm² in the sample." and "Two types of materials . . . alkali halides and aliphatic amino acids . . . can easily be vacuum sublimated or evaporated as uniform thin films . . . readily vaporized by electron beams. Using 100 keV electrons a dose of about $10^{-3}$ C/cm² is sufficient to etch through 30 nm of L-glycine, while a dose of $10^2$ C/cm² is needed to etch through a similar thickness of NaCl."

In the latter reference the resolution is satisfactory but the speed is too slow.

Recently (1986) there has been a report on a new X-Ray lithography device [4]. This article stated:

Submicron lithography using storage ring Xray sources may be closer . . . volume production . . . 1990's. A compact synchroton storage ring will be mated with a vertical stepper . . . will produce 12 A wavelength at 630 MeV energy level . . . When mTED TO THE COSY storage ring, the XRS should have a resolution of 0.2 μm (2000 A) . . . alignment accuracy to within 0.1 μm (1000 A). The stepper will expose wafers up to 8 in. (0.2 m) dia.

A Field-Emission Scanning Transmission Microscope (STEM), shown in FIG. 8, has been described [5,8]. A field emitter is employed to produce an emission area having a diameter of 30–300 A. One magnetic lens with a short focal length and low spherical aberration, is used to demagnify this source to a resolution of 2 to 5 A on the specimen surface. The field emission gun and lens is mounted in an ultrahigh vacuum vessel that operates at $10^{-8}$ to $10^{-7}$ Pa. When a short focal length lens is utilized to keep the system compact, aberration may be compensated by a "stigmator".

In these Prior Art Devices the speed is too slow for the rapid production of devices for the Lepcon TM-Elcon TM Technology described in the copending applications hereinabove specified.

OBJECTS OF THE INVENTION

Objects of this invention are to provide a process and an apparatus for the manufacture of submicron circuits which has:

1. a high speed (about 0.1 m²/s)
2. a large area (1 m²)
3. a high resolution (less than about 5 A).
4. a low cost (less than $250.00/m²-1986 prices)

BRIEF DESCRIPTION OF THE FIGURES

FIGS. 1–10 inclusive illustrate the Prior Art.

FIG. 1 shows a cross section of an electron Field Emitter. [5]

FIG. 2 shows a diagram of the electrical connections of a Field Emission Electron Gun. [5]

FIG. 3 shows a magnified cross section of a single Spindt-Type Field Emission Source. [6]

FIG. 4 shows a magnified cross section of a multielement Spindt-Type Field Emission Source Array. [6]

FIG. 5 is a magnified plan view of a Multielement Spindt-Type Field Emission Source Array. [6]

FIG. 6 is a Fowler-Nordheim plot showing log $(I_c/V_G^2)$ vs. $(1/V_G)$ for a cathode at a constant collector voltage of 1000 v; $V_G$ being the gate voltage and $I_c$ being the collector current. [6]

FIG. 7 shows a Section through a conventional electron microscope, and its control circuits. [5]

FIG. 8 shows a Section through a conventional Field Emission Scanning Transmission Electron Microscope (STEM). [9.1]

FIG. 9 shows a magnified cross sectional view of the electron beam impinging on a glass plate and the volume under the surface penetrated by the beam. [9.2]

FIG. 10 shows a perspective cutaway view of a conventional positive ion beam writer and controls, in which all the lens elements are electrostatic of the Einzel Type. [29]

FIGS. 11–36 illustrate the present invention.

FIG. 11 shows a Fowler-Nordheim Plot for the data of FIG. 6 extrapolated to smaller voltages $V_G$ and smaller currents $I_c$.

FIG. 12 shows a plan view to a scale of 10/1 of a plate being scanned with the demagnified electronic image of the multiemitter array.

FIG. 13 shows a plan view, to a scale of 60/1, of the demagnified electronic image of the emitter array, the emitters of which appear as points simultaneously scanned on the entire image.

FIG. 14 shows a cutaway plan view, to a scale of 10,000,000/1, of the demagnified image of an area surrounding a single emitter, showing a pixel and its scan line, the pixel being formed by an electron beam, a demagnified image of a single emitter source.

FIG. 15 shows a cross sectional plan view, at a scale of about 1000/1, of a super submicron electron beam writer, or "Supersebter TM".

FIG. 16 shows a details of a cutaway plan view section, not the scale, of a Supersebter TM illustrating various components of the electron-optical and operating electrical systems.

FIG. 17 diagrammatically shows the generalized process steps of submicron pattern deposition along a production line on the OX axis of the Supersebter TM, according to Process A.

FIG. 18 diagramatically shows the generalized process steps of submicron metal pattern deposition along a production line on the OX axis of the Supersebter TM, according to Process B.

FIG. 19 diagramatically shows a cross section of an ion coater.

FIG. 20 shows a log-log plot of Electron Beam Voltage $V_o$ and Magnetic Lens Aperture $D_m$ versus the Resolution $d_o$ of the electron beam, for lens focal lengths: f=2.5 m. and f=20 m.

FIG. 21 diagrammatically shows the main step scanning voltage wave applied along the OX axis to stepwise move the demagnified image of the emitter array along a main scan strip.

FIG. 22 diagrammatically shows the main step voltage scanning wave applied along the OY axis to stepwise move the demagnified image of the emitter array to the next adjacent main scan strip.

FIG. 23 diagrammatically shows a sub ramp-voltage scanning wave superimposed on the main step voltage scanning wave, both applied along the OX axis, to simultaneously scan the demagnified image of each emitter in each subsidiary area during a period of constant voltage of the main step voltage scanning waves.

FIG. 24 diagrammatically shows a sub step-voltage scanning wave superimposed on the main step-voltage scanning wave, both applied along the OY axis, to stepwise move a scan strip to the next adjacent scan strip in each subsidiary area, during a period of constant voltage of the main step voltage scanning waves.

FIG. 25 diagramatically shows a pattern modulation voltage applied to the first anodes of the emitter array.

FIG. 26 shows a cross section through the glass plate surface showing a pattern modulation voltage applied in the OX direction parallel to the surface of the plate.

FIG. 27 shows to a magnified scale a voltage time graph of a pattern modulation voltage applied in the OX direction, comprising a ramp-step voltage.

FIG. 28 shows a vector diagram for the deviation of an electron beam by scanning electrodes.

FIG. 29 shows an isometric diagram of a surface in the XYZ reference system, having the coordinates Q(x, y, $\Delta I_e$) in which the electromagnet current I is modulated by a current wave $\Delta I_o$, shown as the line segment PQ parallel to the OZ axis, to focus the scanning electron beam at every position of the point P(x, y, O) on the surface of the glass plate 0.

FIG. 30 shows a cross section through a plate surface having no free electric surface charges.

FIG. 31 shows a cross section through a glass plate having a surface electrical double layer, with the negative charges on the outside of the layer, with no pattern impressed.

FIG. 32 shows a cross section through a glass plate having a surface electrical double layer, with the positive charges on the outside of the layer, with no pattern impressed.

FIG. 33 shows a cross section through a glass plate having a surface electrical double layer, with a pattern impressed by a reversal of the sign of the charge layer.

FIG. 34 shows a cross section through a glass plate having a surface electrical double layer, with the negative charges on the outside of the layer, a pattern being impressed by an electron beam onto adjacent areas of the surface which are thereby charged or not charged.

FIG. 35 shows a cross section through a glass plate having a surface electrical double layer, with the positive charges on the outside of the layer, a pattern being impressed by an electron beam onto adjacent areas of the surface which are thereby charged or not charged.

FIG. 36 shows a cross section through the glass plate and a back electrode, located in a Supersebter TM during pattern inscription with an incident electron beam.

THE SUPER SUBMICRON ELECTRON BEAM WRITER

Figure 7:
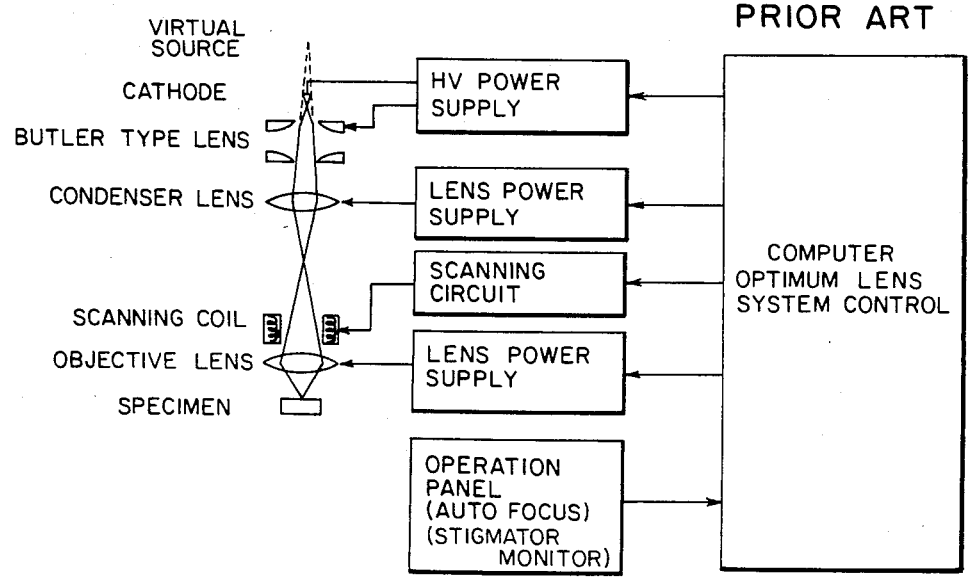
Figure 8:
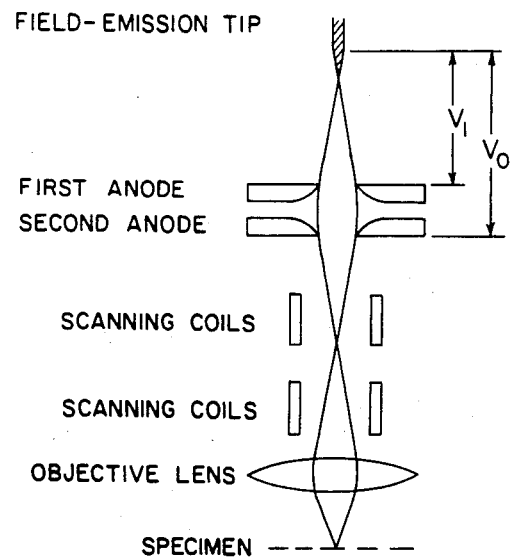
Figure 12:
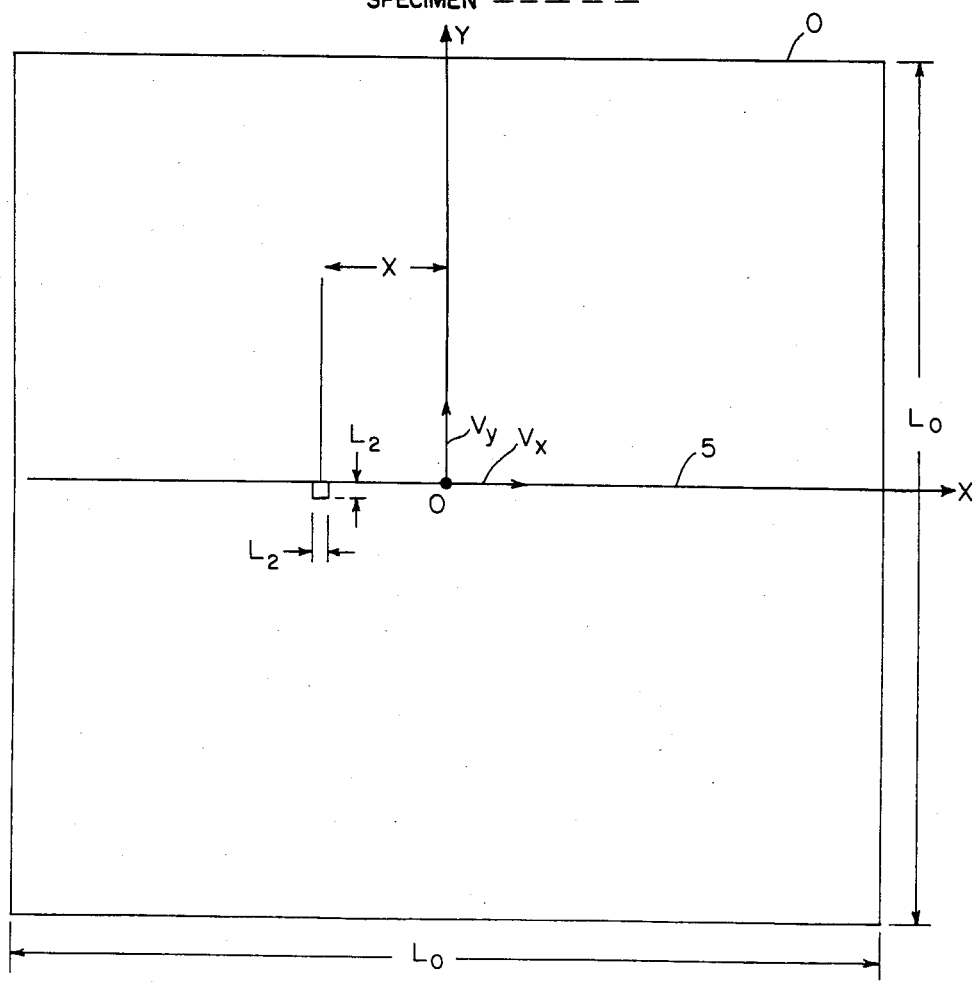
Figure 10:
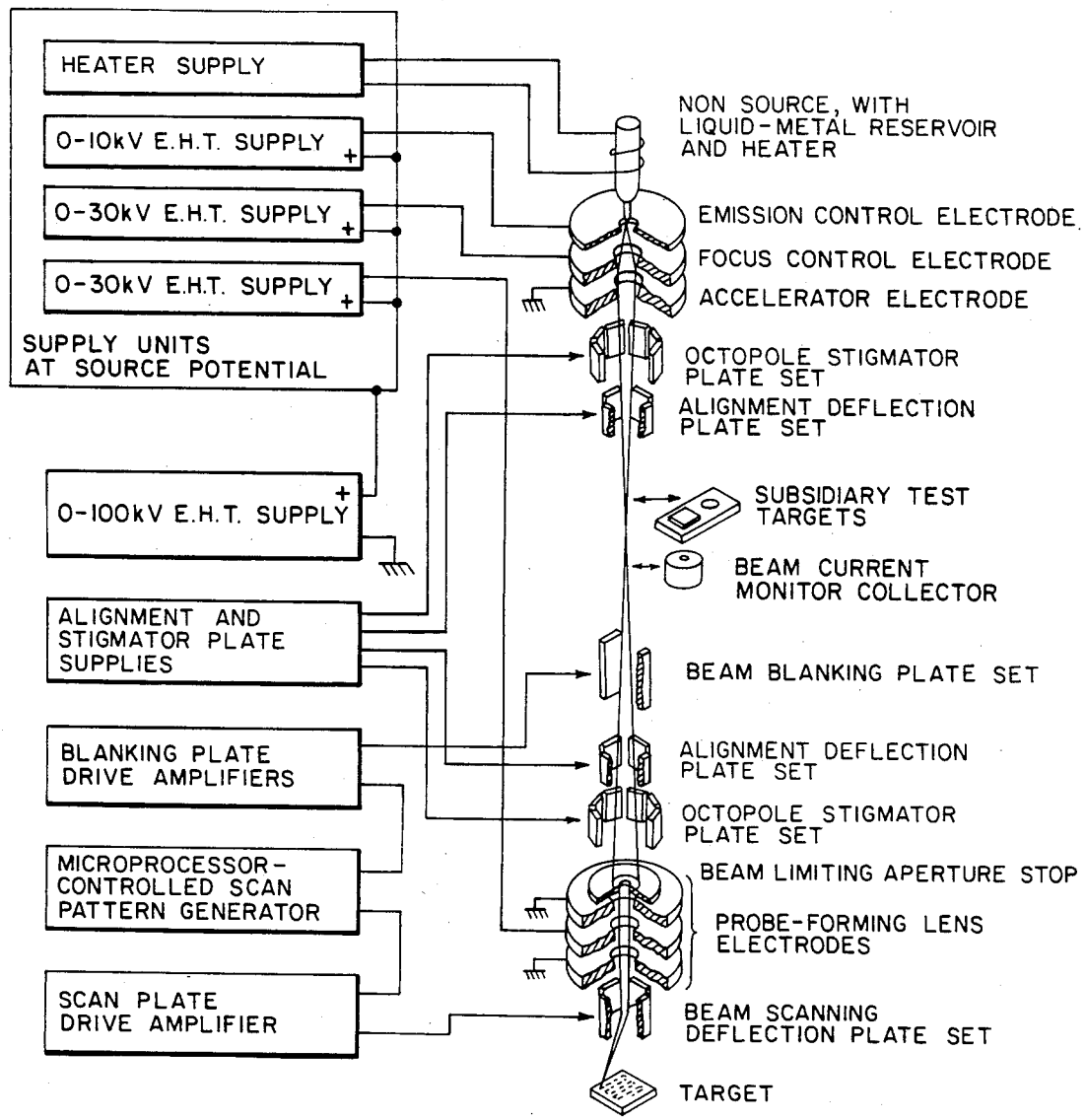
Figure 11:
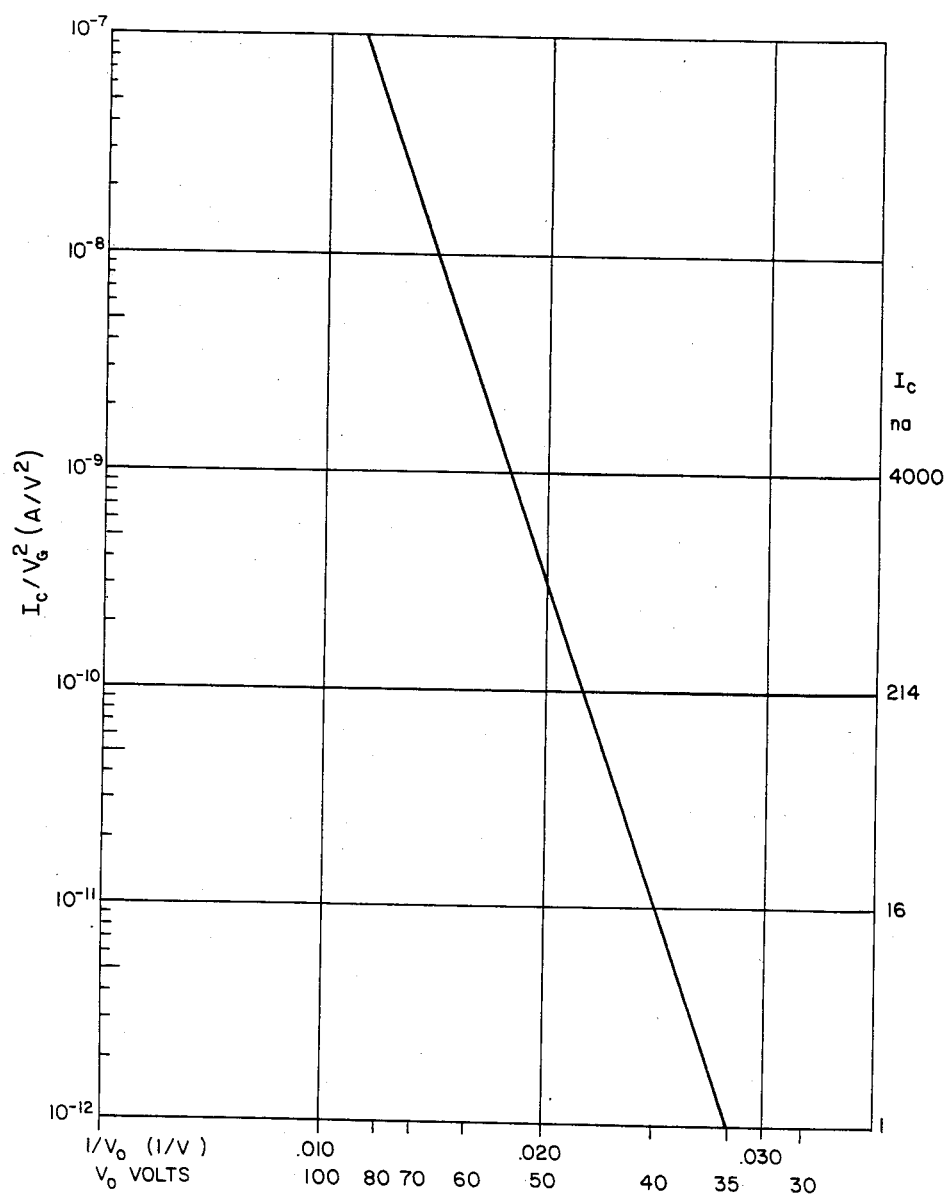

An electron beam writer is similar to a scanning electron microscope (SEM), in which an image of a point source of electrons is focussed onto a surface and scanned; the scattered electrons are collected and the signal processed to form an image of the surface, or to measure its characteristics. The conventional SEM, shown in FIG. 7, is a short compact instrument, usually about 1½ m long. This is to make it portable and able to fit into a laboratory room. To achieve a high resolution of about 5 A, notwithstanding its short length, the magnetic lenses used must have a small aperture ($D_m$=3.5 mm dia.) and a small focal length (f=3.5 mm.); two or three lenses, a limiting aperture plate, a distortion correcting "stigmator", and other refinements produce a small diameter electron beam on the surface. In prior art electron beam writers (EBW) the surface on which the pattern was to be reproduced was coated with a masking coating about 300 A thick, patterned by an electron beam breaking its chemical bonds. This increased the solubility of the mask enabling parts to be washed forming the pattern-mask. Alternatively the pattern was formed by ablation of portions of the coating by the electron beam. In either method, the electron beam needed considerable energy. Consequently, prior art EBW's had to employ an electron beam of high intensity ($5 \times 10^7$ A/m$^2$), 1 nA and 5 A dia.

The present invention utilizes instead a thin surface layer which may comprises a monatomic (1.5 A) or a monomolecular surface layer (to 15 A) thick; and which may also be a surface electrical double layer. Hence, an electron beam having a relatively small current and small energy may be used to form the pattern. Because of the long source-image distance, the thin surface layer, the small beam current, the writing-speed is increased, and the resolution is better. The present invention uses only one or two simple electron lenses.

The high voltage lead connected to the emitter source array 1, is brought out through the insulator 23 at the end of the long main tube 25. The high voltage $V_o$ is applied to the emitter points 13, while the second anode, electrostatic lens 24, is at ground potential and is located at distance $D_3$ from the source emitter array 1. The tube 25 is evacuated to about $10^{-7}$ Pa.

The EBW, or Supersebter ™ tube 25 has a total length D:

$$D = D_1 + D_2 = 50 \text{ to } 1000 \text{ m} \quad (1)$$

The tube 25 may be, for example, 160 m long and 2 m dia. The ratio $D_m/f$ of the lens 26 may be about 0.001. The lens 26 may be electromagnetic, permanently magnetic, or electrostatic, such as an Einzel Type; chosen according to the design objectives.

Figure 16:
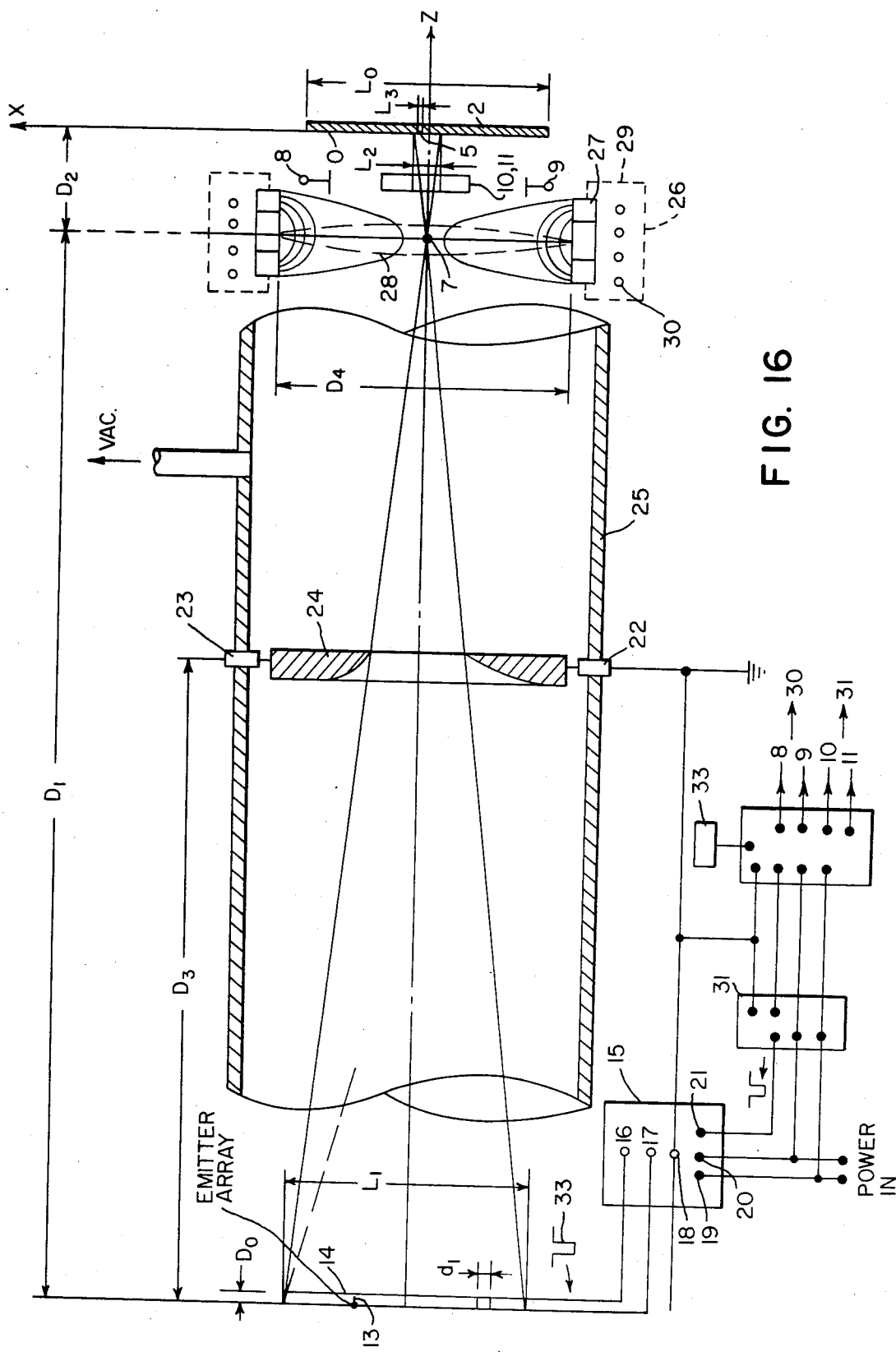

Referring to FIG. 16, the magnetic lens 26 has an aperture, $D_m$, for example: 3 to 30 mm, determined by the resolution $d_o$, voltage $V_o$ and focal length f, of the system design.

To scan the surface of a panel having a 1 m$^2$ surface, depending on the focal length f of the lens 26, the maximum scanning angle, $\overline{\beta}$, is:

$$\overline{\beta} = \tfrac{1}{2} L_o/f \quad (2)$$

$$1.4° = 0.025 \text{ rad.} = 0.5/20 < \tfrac{1}{2}L_o/f < 0.5/2.5 = 0.2 \text{ rad.} = 11.3° \quad (3)$$

Because the EBW of this invention has considerable length D, small beam current $I_b$, and small $D_m/f$ ratio, spherical and other lens aberrations may be negligable even at a voltage $V_o$ as small as 30 kV. This results in the simple design shown in FIGS. 14 and 15.

Figure 14:
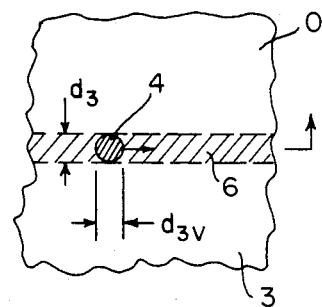

FIG. 14 shows a plan view of one embodiment of the invention in the ZOX plane. The scale along the X axis is magnified relative to the scale along the Z axis to show the electron optics of the device.

Figure 15:
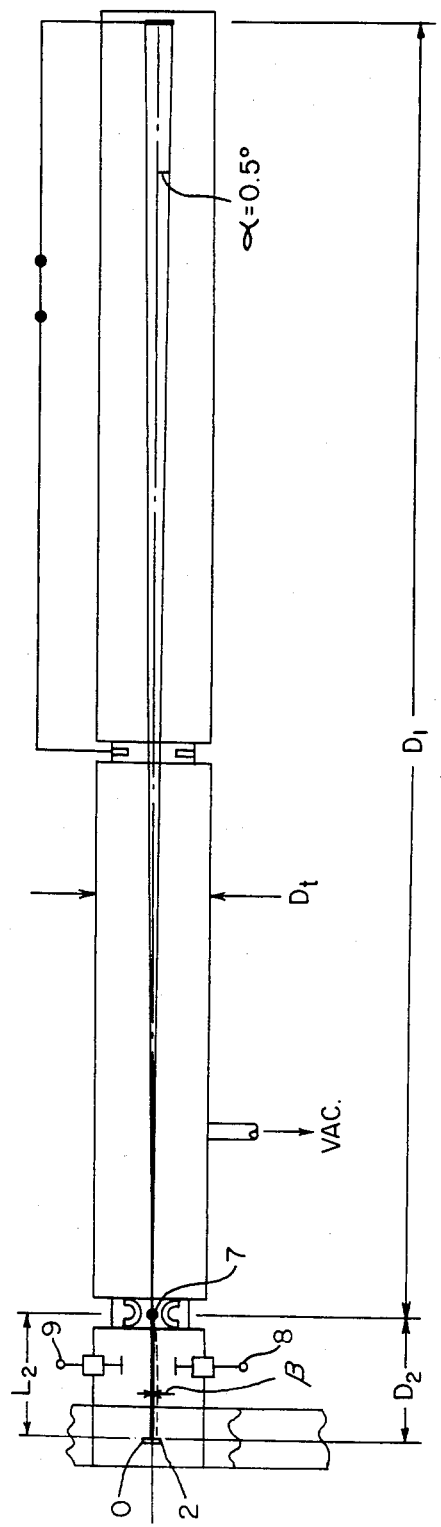

The electron emitter array 1, shown in FIG. 15 (not to scale), may comprise a Spindt-type Array, such as shown in FIGS. 3 and 4 herewith. The multi-emitter array 1 has the dimensions $L_1 \times L_1$; for example: 1 m $\times$ 1 m. The distance between the electron emitters 13 is, for example: [6]

$$d_1 = L_1/N_1 = 10^6/71428 = 14 \text{ μm}. \quad (4)$$

Referring to Example No. 1 herewith, the number of electron emitter points in the array is:

$$N_1 \times N_1 = 71,428 \times 71,428 = 5 \times 10^9 \quad (5).$$

Measuring from the plane of the emitter Array 1, the electrostatic lens 24 is located at a distance $D_3$; and, the magnetic lens 26 is located at a distance $D_1$. To illustrate the projection of the image 2 of the emitter array 1 onto the glass plate 0, the lenses 24 and/or 26 may be shown as a single phantom equivalent thin biconvex optical lens. The plate 0 is located at the distance $D_2$ from the center 7 of the lens system. In Example No. 1: $D_1$=150 m, $D_2$=2.5 m.; and, $D_1/D_2$=60. The image 2 of the emitter array 1 projected onto the Plate 0, then has the dimensions: 0.0167 m $\times$ 0.0167 m; and the distance between the images of the electron emitters is:

$$d_1 = 14/60 = 0.23 \text{ μm} = 2300 \text{ A} \quad (6)$$

Figure 20:
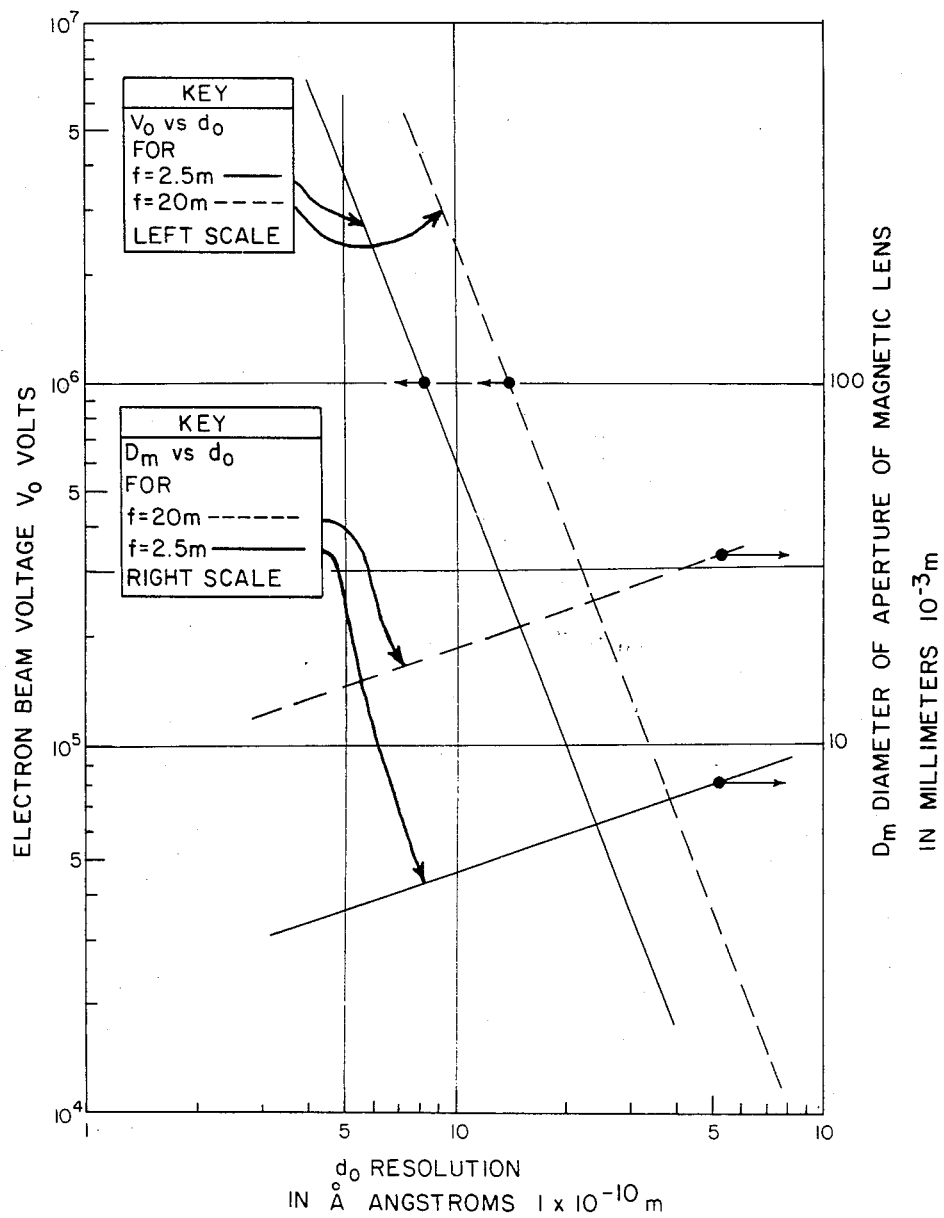
Figure 21:
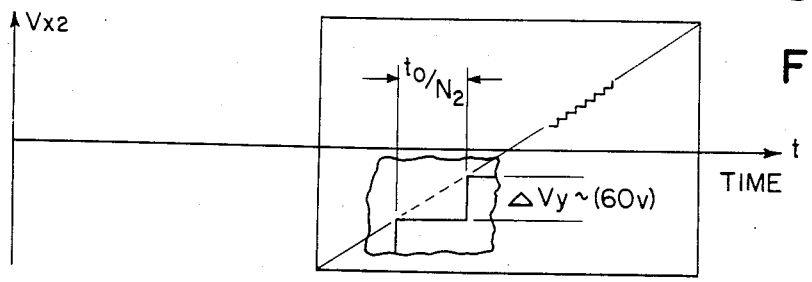
Figure 22:
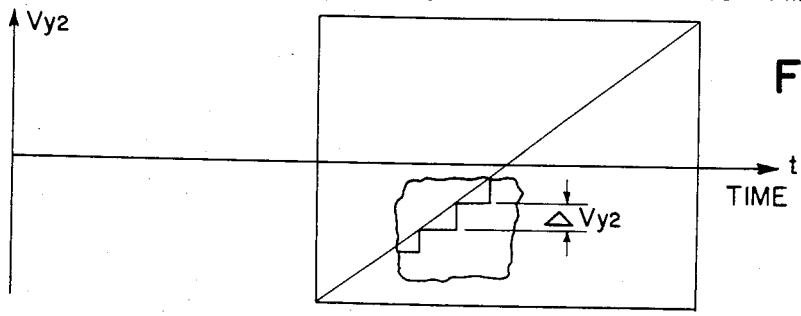
Figure 23:
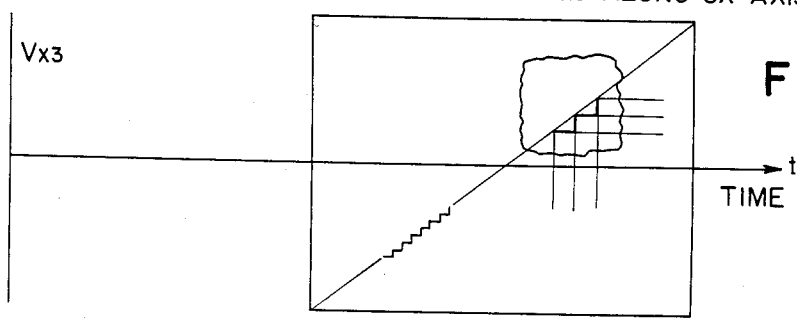
Figure 24:
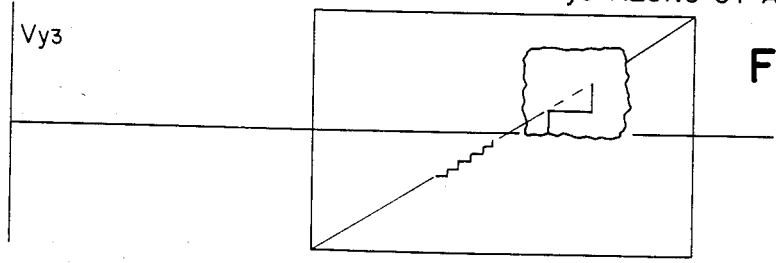
Figure 29:
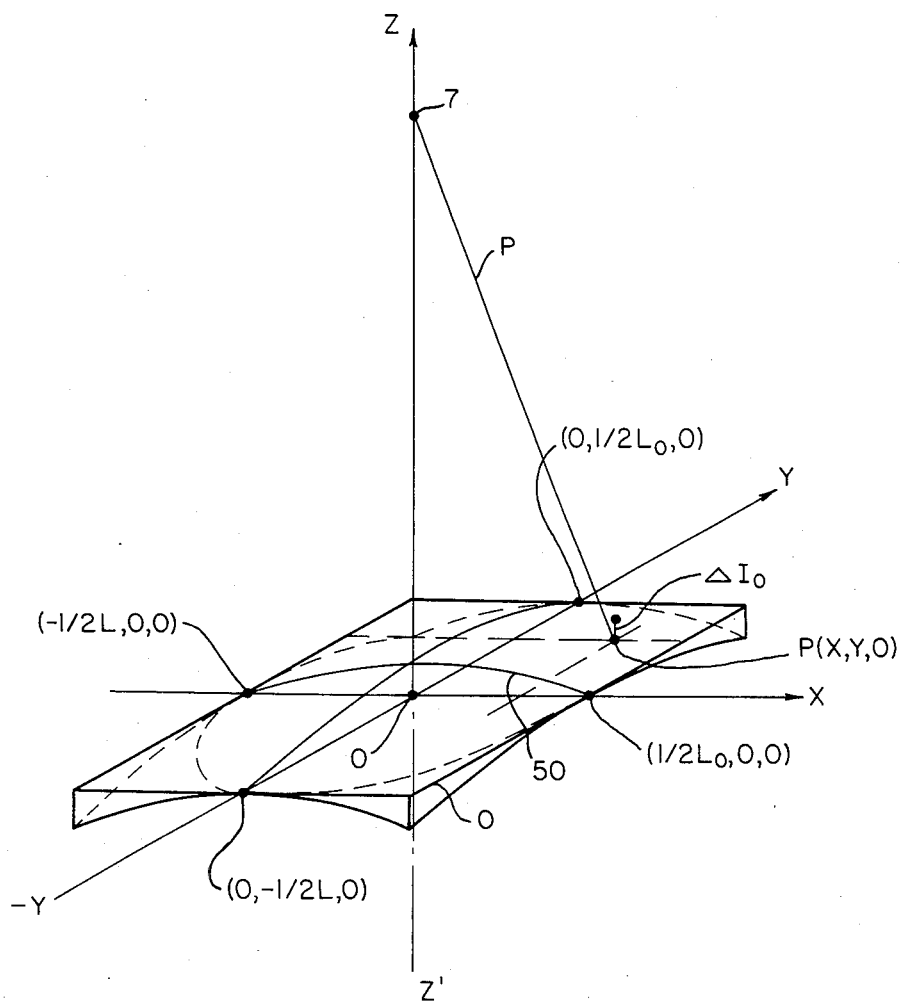

Referring to FIG. 20, for f=2.5 m and $d_o$=7 A, the lens aperture $D_m$=4 mm, and the voltage $V_o$=1.6$\times 10^6$ volts. The image 2 is electrostatically scanned over the surface of the plate 0. The scanning waves are shown in FIG. 15 and 16. The Scanning Voltage Wave 33, applied between the Scanning Electrodes 8 and 9, moves the image 2 along the OX axis in steps. The Scanning Voltage Wave 34, applied between the Scanning Electrodes 10 and 11, (11 not shown) moves the image 2 along the OY axis normal to the plane of the drawing in steps. During each step, a complete scan of each area 3 is simultaneously completed by all the electron beams impinging on plate 0.

THE MAIN SCAN: The Main X and Y Step-Voltage Scanning Waves 30 and 31 are applied to Electrodes 7, 8 and 9 and 10, respectively. These Scanning Voltage Waves move the demagnified image of the emitter array, Area 2, by steps (stop-go) over the entire plate 0.

Figure 13:
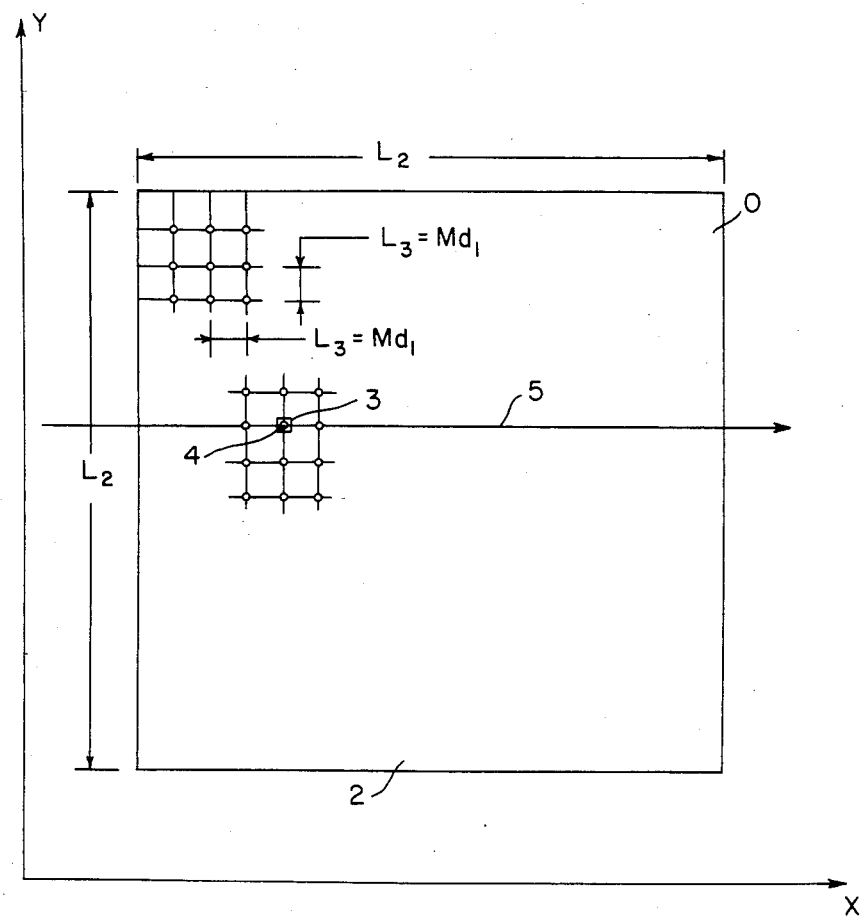

THE SUBSIDIARY SCAN: Referring to FIGS. 13 and 14, Area 2 comprises the demagnified image of all the emitters, each surrounded by its elementary Area 3. During periods when the Main Step-Voltage Scanning Wave is constant; that is, when th demagnified image 2 of the emitter array 1 is stationary, the image 4 of each emitter point 13 is scanned over its elementary Area 3 by an electron beam originating from the same emitter point 13. All images 4 of the emitter points 13 are scanned simultaneously. The Subsidiary Scan is blocked during the time the Main Scan moves the images 4 on Area 2 to the adjacent position on the Plate 0.

Referring to FIG. 16, a computer 32 and program 33 modulates the Voltage 34 to control the imprinted pattern and the blanking of the image between scans. The Pattern Modulation and Blanking Voltage 34 is applied between the Emitter Points 13 and the First Anodes 12 by the the High Voltage Amplifier and Power Supply 15.

Summarizing, the scanning of plate 0 is accomplished by step-scanning the demagnified image of the emitter array 1 over entire surface of the Plate 0. This is accomplished by main X and Y step voltages applied across Electrodes 8 and 9, and 10 and 11 respectively; and by subsidiary ramp and step voltages superimposed thereon, to simultaneously scan all the emitter images while the main step voltages are constant. After the subsidiary scans on Area 2 are completed, all images on Area 2 are blanked and the Main Step Voltages move the images to a new position to repeat the subsidiary scan.

SUBMICRON PATTERN FORMATION

Figure 17:
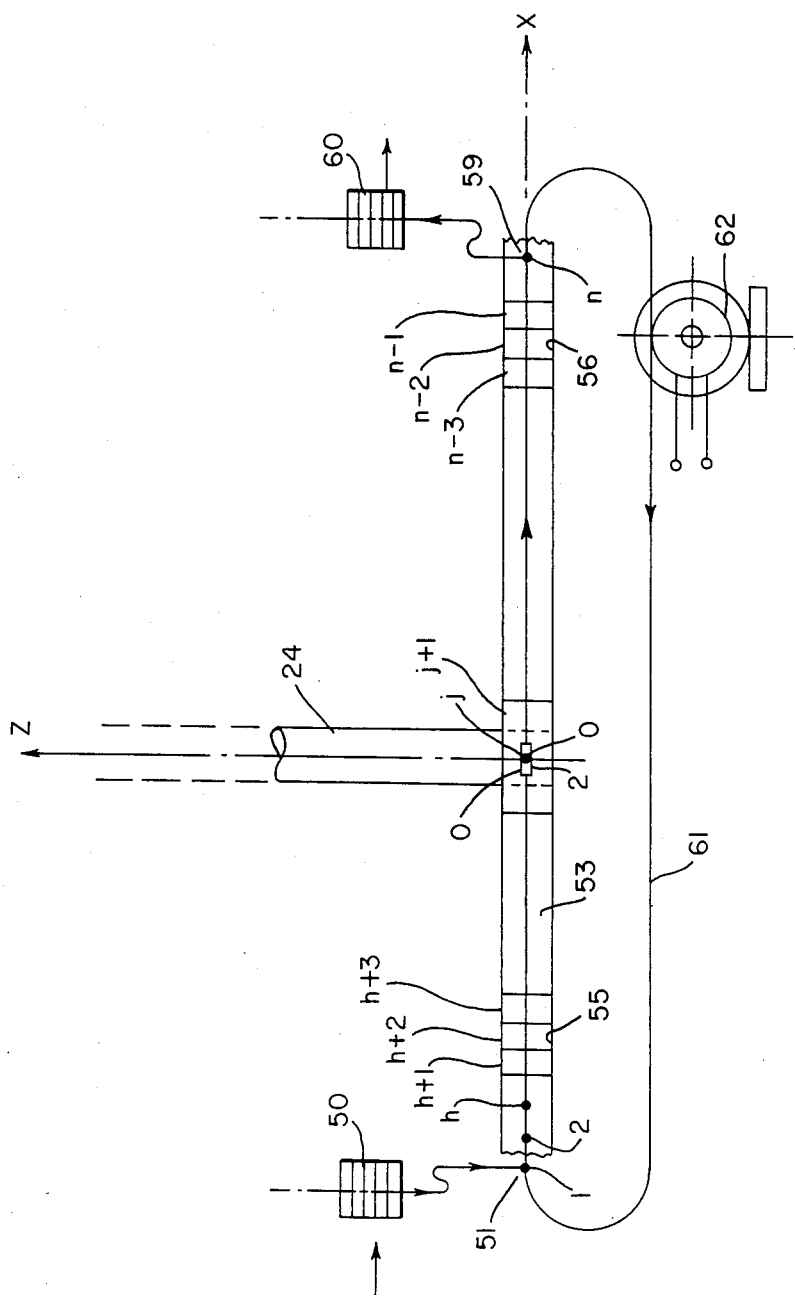
Figure 18:
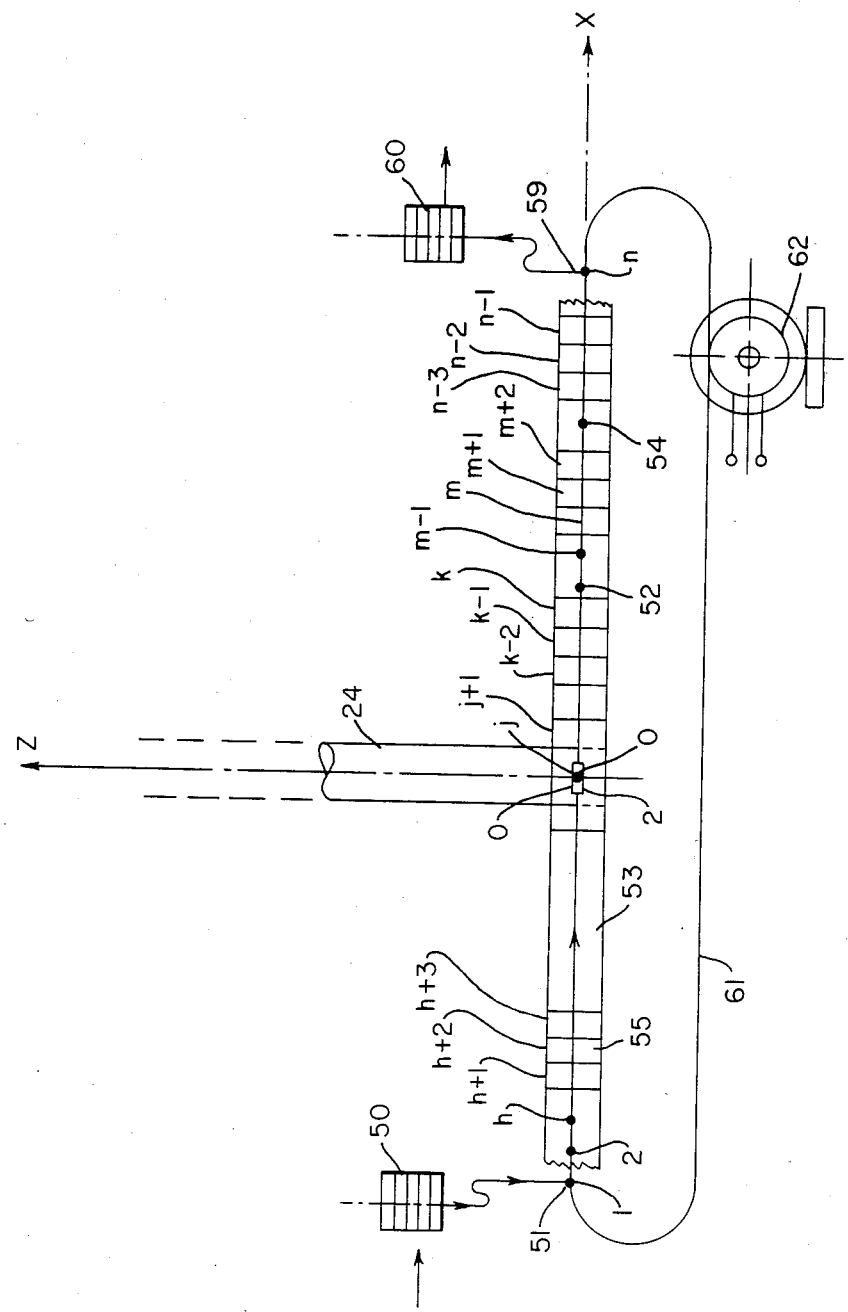

Generalllized production processes for the manufacture of submicron circuits on a plurality of substrate sheets are shown diagramatically in FIGS. 17 and 18. The main or first vacuum tube 24 of the Supersebter TM is along the OZ axis. One or more vacuum tubes 53,54 and atmospheric pressure processing stations 51,52 are located along the OX axis The Production line 61, driven by the stepping motor 62 enters from the left at Station 1, and leaves at 59, Station n, to finished sheet inventory, circulating continuously. In the two production processes described herein, Process A and Process B, substrate sheets, usually glass plates, are supplied from stock 50 to a production line 61. Both Processes include the step of electron beam writing a pattern on the surface of the sheet using the Supersebter TM electron beam writer described herein.

In the generalllized process, Station x refers to a processing step at position x. Referring to FIG. 18, the substrate sheet is loaded from stock 50 onto the production line 61 at Station 1. Several processes, hereinafter described, may be employed at atmospheric pressure from Stations 2 to h. The sheet enters the second tube 53 through the first air locks at Stations h+1, h+2, h+3; respectively, the first low, medium and high vacuum airlocks 55. Vacuum treatment steps are located from Stations h+4 to Station j−1. The electron beam writing step, located at Station j, creates a pattern on the surface of the sheet. This pattern may include a gap; for example 25 to 100 A, used for an assymetric tunnel junction. Further treatment steps may occur at Stations j+1 to k−3. Stations k−2 to k are second airlocks 56, which restore the sheets to atmospheric pressure. In Process B Stations k+1 to m−1 at 52 are at atmospheric pressure for several wet process steps such as the application of electroless metal sensitizing and metal deposition solutions, rinsing and drying.

Next, the sheets may enter airlocks 57 at m, m+1 and m+2. At Station m+3 the deposited metal may be crystallized to single crystal areas, as described in section 08.5 herein. Then, using the ion-coating device shown in FIG. 38, the metal pattern is coated with high and low work function materials respectively at opposite faces of a gap in the deposited metal pattern. At Station m+5 the entire pattern is coated with an insulator coating as described in Section 08.7. After passing through the fourth airlocks 58 at Stations n−3, n−2, n−1, n the sheets pass from the third tube into the atmosphere and is removed from the production line to finished sheet inventory 60. The production line 61 circulates back to the start, and the process is intermittently continuous.

Two basic Processes A and B are described below:

0.1 PROCESS A

FIG. 17 shows a device employing Process A: the first vacuum tube 24 of the electron beam writer joins the production-line second vacuum tube 53 in a T section. Process A takes place entirely within the second vacuum tube 53. The substrate sheets enter at Station 2, being processed before and after the electron beam writing step at Station j, and leaving at Station n as finished sheets. An example of the processing steps which may occur at the various Stations follows:

0.11 The sheets eneter the airlocks at stations h+1 to h+3.

0.12 At Station h+4 the sheets are heated to 700° C. and Argon-plasma cleaned to de-gas their surface.

0.13 The surface chemistry may be changed by ions implanted into the surface by known means.

.14 At Station j the pattern is imprinted onto the surface of the glass panel by the electron beam. The electron beam "sensitizes" the surface atoms by directly altering their electrical and/or chemical properties.

.15 The sensitized surface is exposed to positive ions such as $Sn^{++}$, $Pd^{++}$. The positively charged ions are attracted to negatively charged pattern areas where they deposit on and adhere to the surface; but are repelled by positively charged areas. The positive ions do not adhere to surface areas having no charge, but may reflect elastically therefrom.

.16 The surface is exposed to a metal vapor such as Cu or Al which may comprise positive ions of these metals. These ions are attracted to the previously metallized areas by an induced negative image charge. The thickness of the metal deposit is controlled by the metal vapor concentration and exposure time.

.17 The patterns are formed with a gap S=25 to 100 A at locations where an asymmetric tunnel junction is to be placed. The pattern includes gaps 73, 25-100 A wide in the metal deposit.

.18 The deposited metal is crystallized to single crystal by locally heating with an electron beam or laser, and then cooling to ambient temperature.

Figure 19:
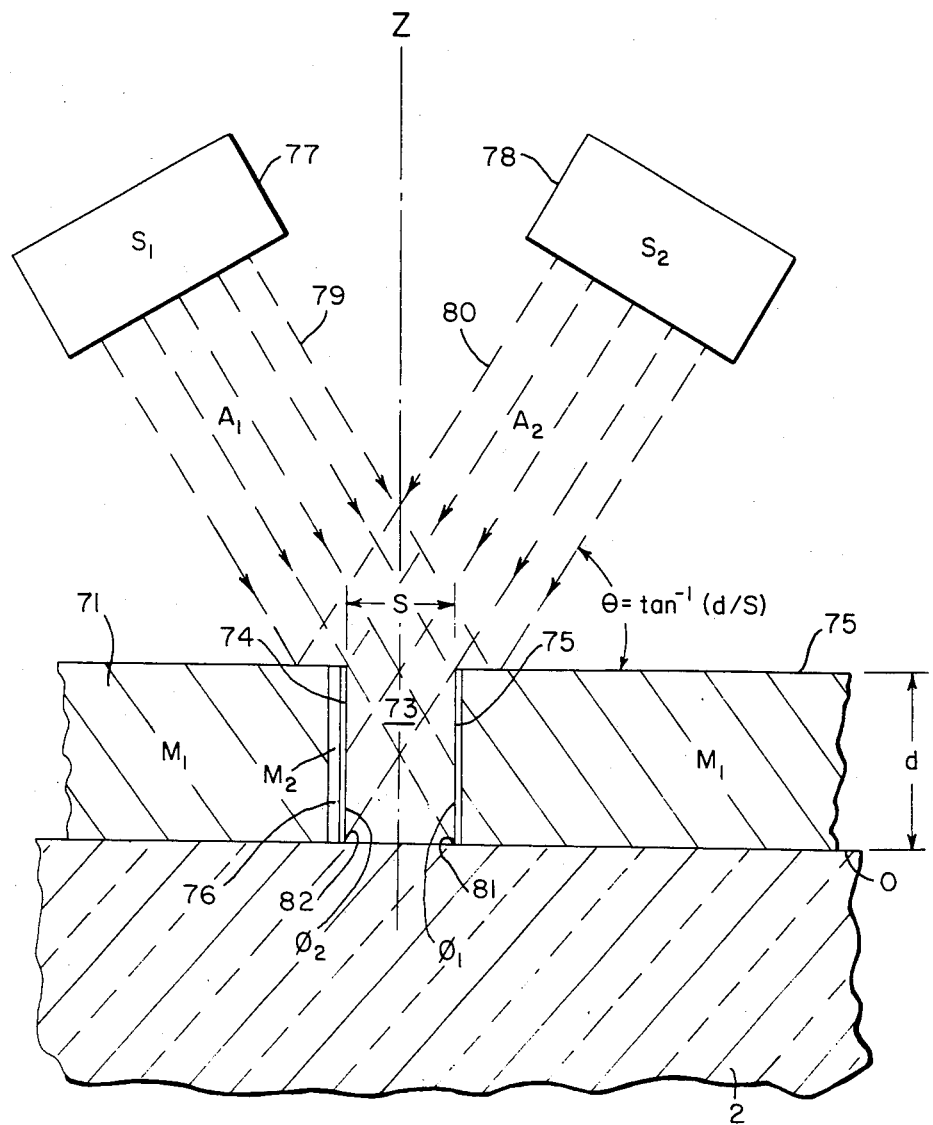

.19 At station m+3 the gaps 73 in the metal pattern are ion coated in an ion coating device such as shown in FIG. 19. This provides the facing surfaces 81 and 82 of the gap 73 with two materials having different work functions $\phi_1$ and $\phi_2$.

.20 The entire surface is then be coated with an insulator layer; for example, silicon dioxide, titanium dioxide, silicon nitride, and the like. The insulating material is chosen from one having a dielectric constant, such that the effective work functions are $0_1/$and $O_2/$. [7; and copending U.S. patent application Ser. No. 637,405]. Conventional vapor coating techniques and apparatus may be used.

.21 The sheet is again removed to atmospheric pressure through the airlocks 58, exiting at 56, Station n, as a finished product.

.2 PROCESS B

FIG. 18 shows a device utilizing Process B. Process B takes place in two vacuum chambers 53 and 54, with a space 52 between them for stations for process steps at atmospheric pressure.

.11 The process steps are the same as in Process A, to and including the electron beam writing step at Station j.

.21 The sheet is removed from the second vaccum tube 53 into the atmosphere through the airlocks 56, and wet-processed with solutions which provide an electroless deposit of metal on the sensitized pattern areas. [17-23 Incl.]

.22 The sheet is then dried, and passed into a third vacuum tube 54 through the airlocks at Stations m to m+2..

.23 From Stations m+2 to n−1, the steps are the same as in Process A, from .18 to .21 inclusive.

SURFACE CHEMISTRY OF GLASS

There is an electric double layer surface charge naturally existing on the surface of glass, which varies with glass composition [13-16 Incl.] The silica network is the most important in determining the surface charge. Most silicas have a population of silanol SiOH groups on the surfaces which may disassociate;

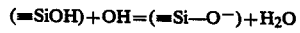
$(\equiv SiOH) + OH = (\equiv Si-O^-) + H_2O$

This forms negatively charged $\equiv Si-O^-$ groups in water, the greater the pH, the greater the number of $\equiv SiO^-$ groups formed. The pH for which $\zeta=0$ is similar to that for other forms of silica pH=2 to 2.5).

The charge on the surface of the glass depends on the physical and chemical treatments to which it is subjected, as discussed in connection with the following Examples:

.1 At Station 2 the glass surface is polished with Cerium Oxide

.2 At Station 3 the surface is rinsed with distilled water.

.3 At station 4 the sheet is dried at about 60 C. for about 10 minutes.

This process results in hydroxyl groups (—OH) attached to the glass surface ($\equiv$Si—OH) making the surface electronegative, and capable of reacting with positive ions in the vapor or liquid phases; such as $Sn^{++}$.

An alternate method is:

.4 Expose the surface of glass to fuming sulphuric acid $H_2$ for a few minutes [24]

This process attaches a sulphonic group —($SO_3^=$) to the glass forming an electronegative surface charge on the surface ($\equiv Si \equiv SO_3$—).

In a similar manner the glass surface may be made electropositive:

.5 At Station 4 the glass surface is exposed to a solution or vapor containing bifunctional electropositive groups such as: (—$NH_2^+$) which results in a glass surface with a positive charge having the composition $\equiv Si-O-NH_2^+$ A positive surface charge tends to repel positively charged ions and attract negatively charged ions from the vapor or solution. A third method is to render the glass surface charge neutral by utilizing reactive monofunctional atoms; such as a halogen, fluorine —F.

Figure 32:
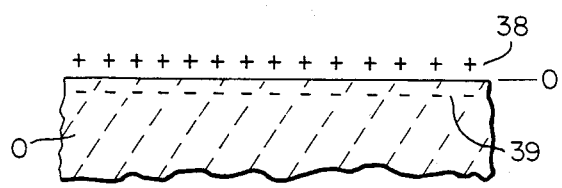
Figure 33:
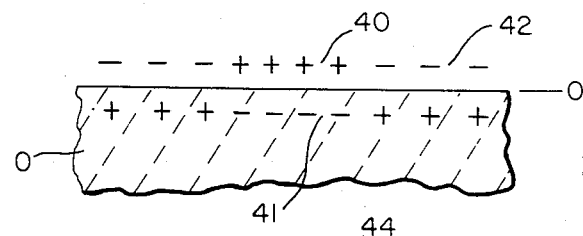

In the present invention the H atom in .3 above may be removed by an electron beam to form patterns on the glasss surface, as shown in FIGS. 32 and 33, forming positively and negatively charged patterned areas. FIG. 32 shows a uniformly charged positive layer 38, and a negatively charged lower layer 39, on the glass surface 0. FIG. 33 shows the same surface after a pattern has been created by the electron beam. The pattern appears as adjacent areas of charge reversal, 40 and 42; with the charges reversed at 41,43 in the lower layer.

The surface chemistry of glass may be altered by for example heating.

Glass surfaces prepared in contact with water as in .1 to .3 above have Silanol groups: $\equiv$SiOH. (08-1)

Such surfaces heated to >400 C. give off water, adjacent groups forming siloxane groups:

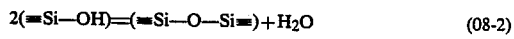
$2(\equiv Si-OH) = (\equiv Si-O-Si\equiv) + H_2O$ (08-2)

At 800 C. only a few silanol groups remain. At 1200 C. no silanol groups remain. On cooling surface rehydration is slow. Aging in water restores the hydrated state.

This invention may utilize an initial heating stage at Station 3 in which the temperature is maintained for a time at a sufficiently high temperature to fully dehydrate the surface.

METAL PATTERN DEPOSITION

The pattern is inscribed by the electron beam writer herein described in Section 07. Metal is deposited on the pattern using Process A or Process B described in Sections 08.1 and 08.2, respectively.

Figure 34:
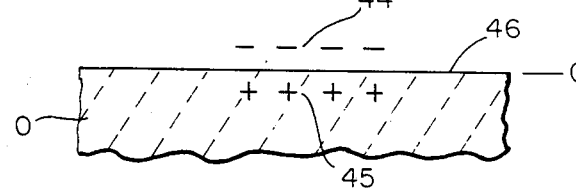

In Process A, metal pattern deposition occurs from the ionic vapor in a vacuum onto charged surface areas that attract the metal ions and cause them to deposit. For example, as shown in FIG. 34, the electronegative portions of the pattern attract $Sn^{++}$ ions which sensitize only those areas. These ions may be produced by known methods [28-30 incl]. A second ion source deposits Copper, for example, $Cu^{++}$ from the ionic vapor, onto the sensitized areas of the pattern.

In Process B, metal pattern deposition occurs at atmospheric pressure from solution, for example by electroless coating of Copper or other metals using known methods [17-23 incl].

SINGLE CRYSTAL METAL GROWTH

The pattern may comprise a deposit of long, narrow thin metal strips, for example having dimensions 1000 A×100 A×50 A. The metal is preferably Copper, Aluminum or other metal having a long mean free path for energetic electrons in a single crystal of the metal. A single metal crystal is essential to the best functioning of the device. At these dimensions metal particles may form single crytals spontaneously; but especially when heated and cooled. An electron beam may be employed to locally heat a plurality of the metal strips to induce their conversion to single crystals. [26.1]

ION DEPOSITION

An Ion Beam Device for producing an asymmetric Tunnel Junction is shown in FIG. 19. The cross section of an assymetric tunnel junction on a substrate surface 0 is magnified to a scale of 10,000,000 to 1. Thus, in the drawing, the gap S=20 A measures 2 cm.

The assymetric tunnel junction comprises a pattern of deposited metal layers 71,72 of a metal $M_1$ on substrate surface 0. There is a gap 73 between adjacent faces 74,75 of the metal layers; for example, 20 to 100 A. Two or more ion sources 77 and 78 are provided to coat the gap faces with various materials having different work functions $\phi_1$ and $\phi_2$. One of the metal faces 73 may first be coated by the ion source 78 with a thin metal layer 76 of a second metal $M_2$ a few atoms thick; then coated with the said materials.

INSULATOR COATINGS

As a last step in the vacuum tube at Station n-1, insulator coatings are applied to the sheet, utilizing standard vapor coating or sputtering techniques and apparatus.

The insulator coating material is selected for its dielectric constant, $\epsilon$, to produce effective work functions $\phi_1/\epsilon$, and $\phi_2/\epsilon$; in accordance with details given in copending U.S. patent application Ser. No. 637,405 entitled "Femto Diode and Applications".; and, At station n, electric connections may be made, and the surface of the sheet further protected by lamination to a second sheet of glass using known methods.

| 09.1 | | SYMBOLS | |
|---|---|---|---|
| 9.1.11 | SCANNING | | |
| $A_1$ | $L_1^2$ | Area of emitter array 1 at the object plane 1. | |
| $A_2$ | $L_2^2$ | Area of the image 2 of the emitter array on the image plane 2 which coincides with the surface of plate 0. | |
| $A_3$ | $L_3^2=(d_1M)^2$ | Area per emitter point on the image of the array 1 on Area 2. | |
| $A_4$ | $d_3^2$ | Area of a pixel on Area 3;$d_o^2$ when $d_o=d_3$. | |
| $d_o$ | | Resolution of the electron beam on the surface of the plate 0. | |
| $d_e$ | | Diameter of a single emitter source. | |
| $d_1$ | $L_1/N_1$ | Distance between the emitter points in the emitter array on object plane 1. | |
| $d_2$ | $Md_1$ | Distance between the images of adjacent emitter points on Area 2;$d_2=L_3$, an edge of Area 3. | |
| $d_3$ | $L_2/N_1$ | dia of pixel 4 = width of a strip 6 scanned in Area 3 by an electron beam of resolution $d_o=d_3$ | |
| $t_o$ | | Time to scan plate 0. | |
| $t_1$ | $t_o/N_2$ | Time to scan strip on Plate 0. | |
| $t_2$ | $t_o/N_2^2$ | Time to scan each area 2 on plate 0. | |
| $t_3$ | $t_o M(d_o/d_1)$ | Time to scan strip 5 on Area 3. | |
| $t_4$ | $t_o(d_o/d_1)^2$ | Time to scan a pixel 4 on Area 3 | |
| D | $D_1+D_2$ | Distance from Array 1 to Plate 0 | |
| $D_o$ | | Distance from Array 1 to first Anode | |
| $D_1$ | | Distance from Array 1 to center of Magnetic Lens | |
| $D_2$ | | Distance from the center of the Magnetic Lens to Plate 0 | |
| $D_3$ | | Distance from Array 1 to the second Anode | |
| $L_o$ | | Length of an edge of the plate 0. | |
| $L_1$ | | Length of an edge of the emitter array in object plane 1 | |
| $L_2$ | $ML_1$ | Length of an edge of Area 2, the image of the emitter array on the image plane 2 which coincides with the surface of the plate 0. | |
| $L_3$ | $Md_1$ | Length of an edge of Area 3;distance between images of adjacent emitters on image plane 2. | |
| M | $d_o/d_e=L_2/L_1=D_2/D_1$ | Demagnification Ratio. | |
| $N_1$ | $L_1/d_1$ | No. of emitters in a row along a length $L_1$ of the emitter array. | |
| $N_2$ | $L_o/ML_1$ | No. of scanning strips 5 of width $L_2$ along an edge $L_o$ on plate 0. | |
| $N_3$ | $N_1^2$ | No. of Areas 3 on each Area 2. | |
| $N_4$ | $Md_1/d_o$ | No. of scan strips 5 on each Area 3. | |
| $N_5$ | $N_4^2$ | No. of pixels 4 on each Area 3. | |
| 9.1.12 | RESOLUTION | | |
| $d_o$ | | resolution, or minimum diameter of the "Circle of Confusion" | |
| $r_i$ | | radius of disc of marginal rays centered on Gaussian image point P' | |
| $C_s$ | | spherical aberration coefficient angle of extreme ray to the lens axis Wavelength of the electron beam | |
| 9.1.13 | BEAM CURRENT | | |
| e | | charge on the electron= $1.601\times10^{-19}$ | C |
| $i_1$ | | current density on substrate | A/m$^2$ |
| $i_b$ | | electron beam current density | A/m$^2$ |
| $n_p$ | | number of atoms per pixel surface | |
| $r_a$ | | radius of atom on substrate surface | A |
| $A_a$ | | surface area of an atom on substrate surface | A$^2$,m$^2$ |

-continued

| 09.1 | SYMBOLS | |
|---|---|---|
| $A_p$ | surface area of pixel | A$^2$,m$^2$ |
| $I_b$ | beam current from a single electron source | $\mu$A,A |
| $V_1$ | voltage between field emission sources and first anode | kV |
| $V_o$ | voltage between cathode and 2nd anode which accelerates the electrons | kV |
| 09.1.14 | MAGNETIC LENS | |
| F | focal length of magnetic lens | m |
| k | a constant of the magnetic lens equation | |
| s | gap at pole-pieces | m |
| B | Magnetic Field Intensity in Gap parallel to the lens axis | Tesla |
| I | Current in electromagnet | Amps |
| N | No. of turns on electromagnet | |
| $V_r$ | Equivalent Relativistic Volts | Volts |
| 9.1.15 | IMAGE ROTATION | |
| $\theta_o$ | Angle of Image Rotation | Rad;° |
| 09.2.21 | SCANNING | |

Example No. 1: Given values consistent with references cited:

| $d_o$ | =5 A | Resolution [1] |
|---|---|---|
| $d_e$ | =300 A | Emitter Diameter [5] |
| $d_1$ | =14 $\mu$m | Emitter Spacing [6] |
| $L_o$ | =$L_1$ = 1m | Edges: 1,0 |
| $D_2$ | =2.5 m. | Lens to Image distance |
| $t_o$ | =10 s | Scan Time Plate 0 |

Find: $M, L_2, D_1, N_1, N_2, N_4 t_2, t_3, t_4$.

Answers:

M = $d_o/d_e$  Demagnification Ratio  (1)
   = 5/300 = 1/60

$L_2$ = $ML_1$  Side of Area 2  (2)
    = (1/60)×1 = 1/60 m=16.67 cm.

$D_1$ = $D_2/M$  Object to Lens Distance  (3)
    = 2.5/(1/60) = 150 m $N_1$ = $L_1/d_1$  Emitters per row  (4)
    = 1/14 × $10^{-6}$ = 71,428

$N_1^2$ = 71,428$^2$ = 5.0 × $10^9$  (5)
Emitters per Array $N_2$ = $L_o/L_2$ = $L_1/L_2$=1/M = 60  (6)
Scan strips on plate 0

$N_2^2$ = 1/$M^2$  Areas 3 on plate 0  (7)
     = 1/(1/60)$^2$ = 3600.

$N_3$ = $N_1^2$  Areas 3 on each area 2.  (8)
    = 5.0 × $10^9$ $N_4$ = $Md_1/d_o$  Scan Lines on each Area 3  (9)
    = (1/60)14×$10^4$/5 = 467

$t_2$ = $t_o/N_2^2$ = $t_oM^2$  (10)
Time to scan each Area 2.
   = 10/3600 = 2.78 × $10^{-3}$ = 2.78 ms.

$t_3$ = $t_2/N_4$ = $t_oM^2/M(d_1/d_o)=t_oM(d_o/d_1)$
Time to scan strip 5  (11)
   = 10×(1/60)×5/14×$10^4$ =6×$10^{-6}$s $t_4$ = $t_3/N_4=t_oM(d_o/d_1)/M(d_1/d_o)=t_o(d_o/d_1)^2$
Time to scan pixel 4  (12)
   = 10(5/14 × $10^4$)$^2$ =1.28 × $10^{-8}$ s.

RESOLUTION [8,9]

The wavelength of the electron for V volts, is:

$$=12.4/V^{\frac{1}{2}} \, A \quad (13)$$

In the object plane the equivalent disc has a radius:

$$r=r_i/M \quad (14)$$

In the image plane the minimum cross section of the electron beam is the "Circle of Confusion" which is also the resolution:

$$d_o=\tfrac{1}{2}C_s\alpha^3 \quad (15)$$

For the best resolution $\alpha$ must be small.

Numerically $C_s$ is approximately equal to F, the focal length of the lens:

$$C_s = F \tag{16}$$

From (15) and (16):

$$\alpha = (2d_o/F)^{\frac{1}{3}} \tag{17}$$

The aperture diameter $D_m$ of the magnetic lens is:

$$D_m = 2\alpha F \tag{18}$$

The resolving power of a lens is limited by diffraction to:

$$d_o = 0.6\lambda/n \sin\alpha \tag{19}$$

In an electron microscope $n=1$ and $\alpha$ is small, so $\alpha \cong \sin\alpha$; and (16) becomes:

$$d_o \cong 0.6\lambda/\alpha \tag{20}$$

From (15) and (16):

$$d_o = \tfrac{1}{2} F\alpha^3 \tag{21}$$

The choise of the values of the resolution $d_o$, and the Focal Length F of the magnetic lens determines the electron beam voltage V, and the aperture of the magnetic lens $D_m$. The equations relating these quantities are derived:

From (17) and (18):

$$D_m = 2^{4/3} F^{\frac{2}{3}} d_o^{\frac{1}{3}} \tag{22}$$

From (13), (17) and (20):

$$V = 34.9 \, (F/d_o^4)^{\frac{2}{3}} \tag{23}$$

Equations (22) and (23) are plotted in FIG. 20 on the log-log graphs showing the Voltage V and the Diameter $D_m$ of the magnetic lens versus the Resolution $d_o$ for various values of the Focal Length F.

BEAM CURRENT

For the purpose of modifying the surface chemistry of plate, it is assumed:

1. The electron beam impinges 1 electron per surface atom.
2. The atomic diameter at the surface is: $d_a = 1.5$ A.
3. The electron beam has a diameter equal to its resolution: $d_e = d_o = 5$ A
4. The number of atoms per pixel equals $N_e$, the number of electrons impinging per pixel:

$$N_e = (d_o/d_a)^2 \tag{24}$$

$$N_e = (5/1.5)^2 = 4.33$$

5. The scanning times are:
4.1. For 1 m² on plate 0 $t_o = 10$ s.
4.2. For 1 pixel: $t_4 = 1.28 \times 10^{-8}$ s.
6. The beam current per emitter is:

$$I_b = N_e e / t_4 \tag{25}$$

$$I_b = 4.33 \times 1.60 \times 10^{-19} / 1.28 \times 10^{-8}$$

$$I_b = 54 \times 10^{-12} \text{ Amp.} = 54 \text{ pA}$$

7. There are $N_1^2 = 5 \times 10^9$ emitter per array.
Hence the total emitter curent for the entire array is:

$$I_{ar} = N_1^2 I_b \tag{26}$$

$$I_{ar} = 5 \times 10^9 \times 54 \times 10^{-12}$$

$$I_{ar} = 0.27 \text{ Amp}$$

The beam current of 54 pA is much smaller than the 1–10 $\mu$A available from a field emission source [5]. The source diameter assumed in Example No. 1 is: $d_e = 300$ A [5] However, with the emitter current decrased by a factor of about 10⁵ in this example the emission source diameter may also decrease. If this is the case, the emitters can be placed closer together. The value of M and the length of the device is thus considerably decreased.

MAGNETIC LENS

It is known, for a thin magnetic lens: [9]

$$(1/f) = (1/D_1) + (1/D_2) \tag{27}$$

From (27) and the definition of M:

$$(D_2/f) = 1 + M \tag{28}$$

$$\text{If: } 0 < sk < 2 \tag{29}$$

$$\text{Then: } f = 1/sk^2 \tag{30}$$

Example No. 2:

Given: $f = 2.5$ m.; $s = 0.2$ m.; $M = (1/60)$; $V_r = 10^6$ volts
Find: $D_2$; k; $V_o$; NI
Answers:
From (28) and (29):

$$D_2 = 2.5[1 + (1/60)] = 2.517 \tag{31}$$

$$k = (sf)^{-\frac{1}{2}} = (0.2 \times 2.5)^{-\frac{1}{2}} = 1.4 \tag{32}$$

This is in accord with condition (16), so (17) is applicable:
An approximation for $V_r$ is: [9.1]

$$V_r = V_o[1 + V_o]^{\frac{1}{2}} \tag{33}$$

A solution of (20) for $V_o$ for $V_r = 10^6$ is:

$$V_o = 629{,}000 \text{ volts} \tag{34}$$

The equation for Magnetic field intensity is: [9.2]

$$B = 4 \times 10^{-7} NI/s \tag{35}$$

The magnetic lens Equation is: [9.2]

$$k = (e/8m_o)^{\frac{1}{2}} B/V_r \tag{36}$$

Using (32) and (36) and solving for B:

$$B = V_r/(sf)^{\frac{1}{2}}(e/8m_o)^{\frac{1}{2}} \tag{37}$$

$$B = (10^6)^{\frac{1}{2}}/1.41 \times 1.48 \times 10^5 \tag{38}$$

$$B = 9.4 \times 10^{-3} T = 94 \text{ Gauss} \tag{39}$$

The Ampere-Turns on the electromagnet is, from (35):

$$NI = 94 \times 10^{-4} \times 0.2/4 \times 10^{-7} \quad (40)$$

$$NI = 1500 \text{ ampturns} \quad (41)$$

IMAGE ROTATION

A magnetic lens, unlike an optical lens, rotates an image. For a constant field B, the rotation $\theta_o$ of the image is: [10]

$$\theta_o = (e/8m_oV_r)^{\frac{1}{2}} Bs \quad (42)$$

For the values in this Example:

$$\theta_o = 1.482 \times 10^5 \times (10^6)^{\frac{1}{2}} \times 94 \times 10^{-4} \times 0.2$$

$$\theta_o = 0.28 \text{ rad.} = 16° \quad (43)$$

Because of image inversion, the rotation of the image by this weak magnetic lens is: $180° + \theta_o$. To compensate, an edge of the emitter array 1 is rotated to an edge of the plate 0.

Example No. 3:

| GIVEN: | (a) | Focal length of magnetic lens: | $F = 2.5$ m. |
| --- | --- | --- | --- |
| | | Resolution of the electron beam: | $d_o = 5$ A |
| | (b) | Same for: | $F = 2.5$ m. $d_o = 20$ A |
| | (c) | Same for: | $F = 20$ m $d_o = 20$ A |
| FIND: | $V =$ | Voltage of the electron beam | |
| | $D_m =$ | Diameter of the Aperture of the magnetic lens. | |
| ANSWERS: | | From the graphs in FIG. 20: | |
| | (a) | | $V = 4$ MeV $D_m = 3.6$ mm. |
| | (b) | | $V = 100$ keV $D_m = 5.7$ mm |
| | (c) | | $V = 400$ keV $D_m = 23$ mm. |

10.

DISCUSSION

The present device may be employed for the rapid manufacture of submicron circuits as hereinabove set forth. A particular application is the rapid fabrication of submicron array of light-electric power converting circuits of the type disclosed in my copending application, in FIGS. 3A and 15, Ser. No. 637,405 filed 08/03/84, now issued as U.S. Pat. No. 4,720,642 on Jan. 19, 1988 included herein by reference.

These devices comprise single crystal metal strips of Copper, Aluminum, or the like; in which, an energetic electron provided by direct conversion from photon energy travels freely in the metal for distance of about 10,000 A without collision with an impurity atom; and, hence without energy loss.

The strips may be for example 600 A long, separated by a "tunnel-junction" gap of 28-35 A. The width of the strip may be, for example, 30 A.

In the formation of this structure a single scan with a 30 A dia. electron beam may be used. The electron beam is preferably shaped with a square or rectangular section to provide a constant gap of about 30 A between successive in-line strips.

Example 4:
GIVEN: $F = 20$ m; $d_o = 30$ A
FIND: $D_m$, $V$, $M$, $D_3$
ANSWERS:
From FIG. 20, Equations (27) and (28), using $d_o = 30$ A, and $F = 20$ m.:

$$D_m = 25.5 \text{ mm.} \quad (44)$$

$$V = 104 \text{ Kilovolts.} \quad (45)$$

The demagnification ratio may now be increased to:

$$M = d_o/d_e = 30/300 = 1/10 \quad (46)$$

The length of the tube is:

$$D_3 = D_1 + D_2 = F[(1/M) + 1] \quad (47)$$

For this example:

$$D_3 = 20 \times 1.1 = 220 \text{ m} \quad (48)$$

Features and advantages of the present invention are:
1. A small diameter image is formed from the electron emitter array by a demagnifying lens.
2. One or two long focus electron lenses of the magnetic or electrostatic type are used resulting in negligible aberration.
3. A large aperture lens may be used: to 30 mm.
4. The focal length of the lens is 2.5 m to 20 m, compared to about 3.5 mm in a standard SEM.
5. A plurality of images of the electron emitter array is simultaneously imaged onto the work surface.
6. Writing speed is increased by the simultaneous scanning with a plurality of electron beams. For example: $2 \times 10^9$ electron beams are scanned simultaneously to imprint the same number of identical patterns.
7. The pattern is imprinted by an electron beam impinging on a surface coated with a monoatomic or monomolecular layer, which may comprise an electric double layer. The electron beam breaks the chemical bonds, changes the chemical or electrical characteristics, or ablates the layer. Prior art masking layers were usually about 300 A thick. The layer used herein in only $\frac{1}{2}\%$ to 10% of the thickness of prior art coatings. Consequently the present method is more efficient than prior art methods, requiring considerably less electron beam energy per unit area.
8. Less electron beam energy per unit area requires a smaller beam current, less current density, and less voltage. This results in better resolution and increased writing speed.
9. A Large area plate is imprinted with a repetitive pattern by the stepwise simultaneous scanning of the demagnified image of the Array over the entire area of the plate.

The Analysis and Computations in Example 1 show:
10. The scanning time $t_4$ of pixel 6 on Area 3, at maximum resolution, is independent of the Demagnification M.
11. The Demagnification M depends on the ratio of the Emitter Source Diameter $d_e$ to the diameter of the resolution disc $d_o$. In the example: $d_e = 300$ A and $d_o = 5$ A, hence: $M = 5/300 = 1/60$. If $d_e = 100$ A, $M = 1/20$ and the length $D_1$ is decreased from 150 m to 50 m.

12. The number of Scan Strips and pixels depends on the detail required by the pattern impressed on the surface of Plate 0. The number of scan strips and pixels may be varied by changing $d_1$, the distance between Emitters on the array, keeping M and $d_o$ constant; or, for less resolution: $d_3 > d_o$.

13. To modulate the pixel 4 in the time $t_4$, according to (12) in Example 1, requires a modulating signal applied to the Voltage $V_1$ (shown in FIG. 2) operating at about 8 Ghz. This is within the state of the Art.

Figure 30:
Figure 31:
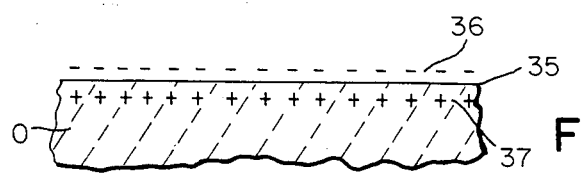

FIGS. 30 to 32 show various continuous surface layers of noncharge and electric charge on which the pattern may be inscribed by the electron beam writer.

FIG. 30 shows a noncharged surface 35 comprising, for example, siloxane groups with no exposed reactive chemical radical. Such a condition may be reached by heating the glass as previously described.

FIG. 31 shows a glass surface having a an electronegative charge layer 36 over an electropositive layer 37, forming a monomolecular electric double layer. The layer 36 may comprise, for example, sulphonic radicals, previously described herein.

FIG. 32 shows a glass surface with an electropositive surface layer 38, over an electronegative layer 39, forming a monomolecular electric double layer on the surface. The electropositive radical may be, for example an amino radical, previously described herein.

FIG. 33 shows a charge pattern inscribed by the electron beam, for example, in the charge structure shown in FIG. 32. In this case, the electron beam neutralizes an electropositive area and adds negative charge to reverse the charge pattern.

FIG. 34 shows a pattern inscribed by the electron beam which comprises adjacent negative charge-noncharge areas 44,45 respectively, produced, for example by the electron beam breaking chemical bonds of the noncharged siloxane chains on the glass surface, exposing negative free bond of an oxygen atom.

Figure 35:
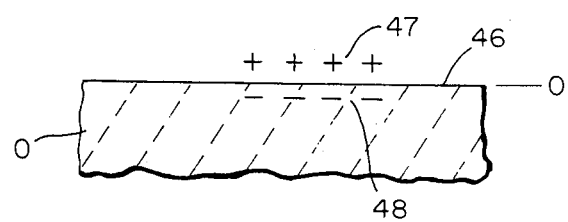

FIG. 35 shows a noncharge-positive pattern 46,47 respectively, produced by an electron beam on the electropositive surface layer 38 of FIG. 32. In this case the amino radicals are neutralized or ablated and free oxygen bonds are taken to form noncharged surface areas of siloxane.

Figure 36:
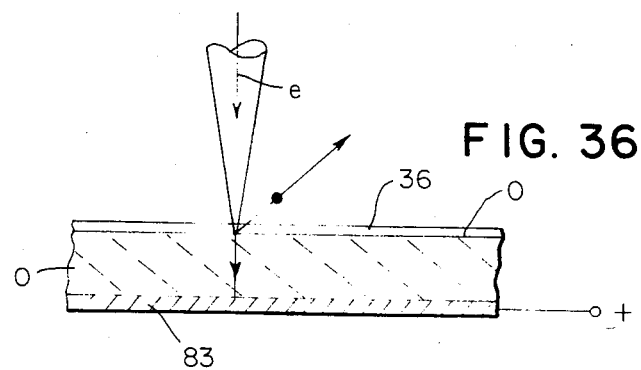

FIG. 36 shows a cross section through a substrate sheet 0 mounted on a base electrode 83 in an electron beam writer of this invention. The base electrode 83 may be connected to a positive voltage source to attact and discharge electrons driven through the sheet by the high velocity electrons in the beam.

I do not wish to be limited by the examples and illustrations of this invention given herein. Various modifications may be made by those skilled in the art without departing from the scope of these inventions and the claims appended hereto.

REFERENCES

[1] Nanometer-Scale Fabrication Techniques; R. E. Howard and D. E. Prober VLSI Electronics-Microstructure; Science Vol. V. 1982 Academic Press, Norman G. Einspruch, Ed. pp. 1–24 incl., 118 References, 8 Tables, 15 FIG.

[2] R. E. Howard et al, Science 221, 117 (1983)

[3] In situ vaporization of very low molecular weight resists using ½ nm diameter electron beams; M. Isaacson and A. Murray; J. Vac. Sci. Technol., Vol. 19, No. 4. Nov.-Dec. 1981, 1117–1120

[4] X-Ray Lithography Gets Closer; Jerry Lyman, Electronics May 26, 1986 p. 15–16.

[5] Scanning Electron Microscope S-800;
Catalogue EX-E591P 1986;
Hitachi, Ltd., Tokyo, Japan;
  FIGS. 1 and 2: page 4;
  FIG. 7: Page 6;
  "The Field Emission Electron Source" and Table: page 4

Figure 6:
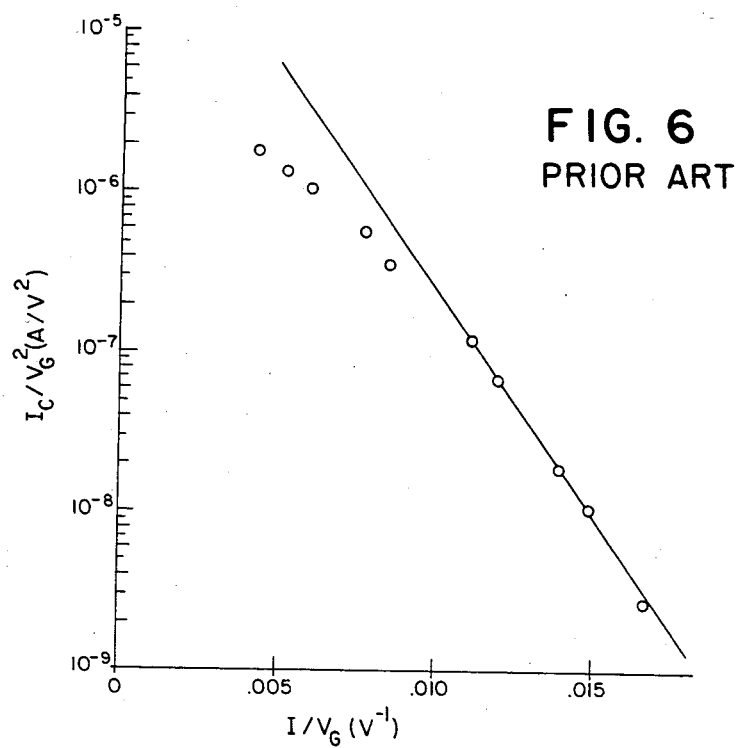

[6] Evaluation of the Emission Capabilities of Spindt-Type Field Emitting Cathodes
Forman, Ralph
NASA Lewis Research Center, Cleveland, Ohio, 44135
Applications of Surface Science 16(1983)277–99
  FIG. 3: Page 284
  FIGS. 4 and 5: Page 278
  FIG. 6: Page 285

[7] DIELECTRIC CONSTANTS OF CERAMICS, Table includes:
Dielectric Strength v/mil
Volume Resistivity ohm-cm @23° C.
  CRC Handbook of Chemistry and Physics Page E-55,65th Edition, 1985 CRC Press, Inc. Boca Raton, Fla.

[8] The Principles and Practice of Electron Microscopy
Ian M. Watt
Cambridge University Press; 1985;
  Pages 10–19 inc.; particularly page 13.

[9] Transmission Electron Microscopy
Physics of Image Formation and Micro Analysis
Reimer, Ludwig
Springer-Verlag
Berlin Heidelberg New York Tokyo 1984
  Page 88 Table 4.1 Field Emission cathode
  Page 88 Table 4.1 Field Emission Cathode Data
  pages 104–105 Spherical Aberration and Error Disc
  Pages 122–123 Field Emission Scanning Transmission Electron Microscope
  Pages 272 –273 Electron Spread in Thin Specimens
  Pages 284–285 Grid and Anode Electrodes with Field Emitting Electrode.

[10] Experimental High Resolution Electron Microscopy
John C. H. Spence
Clarenden Press Oxford 1981
Chapter 2, Electron Optics, pages 28–59

[11] Atomic Resolution of TEM Images of Surfaces
The newest Electron Microscopes that crack the 2 Angstrom barrier can resolve atom positions on metal and semiconductor surfaces.
Robinson, Arthur L.
Science, Vol. 230, pages 304–306

[12] Dynamic Atomic-Level Rearrangements in Small Gold Particles.
Smith, Petford-Long, Wallenberg and Bovin;
Science Volume 233,
Pages 872–874

[13] Discharges and Mechanoelectrical Phenomena in Charged Glasses
Vorob'ev, Zavadovskaya, Starodubstev, and Federov S. M. Kirov Tomsk Polytechnic Institute
Izvestiya Vishhikh Uchebnykh Zavedenii Fizika No. 2, pp 40–46 February 1977

[14] Elecret Effect in Silica Glass containing Two Types of Alkaline Ions

E. Rsiakiewicz-Pasek
Institute of Physics,
Technical University of Wroclaw, Poland
Journal of Electrostatics, 16 (1984) 123–125
Elsevier Science Publishers B.
[15] Surface Charges in a Zinc Borosilicate Glass-/Silicon System
   Misawa, Hachino, Hara, Ogawa and Yagi Hitachi, Ibaraki, Japan J. Electrochem Soc.
   SOLID STATE SCIENCE AND TECHNOLOGY pp. 614.616, Mar. 1981
[16] Surface Charge of Vitreous and Silicate Glasses in Aqueous Electrolyte Solutions
   Horn and Onoda
   Journal of The American Ceramic Society pages 523–527, Vol. 161 No. 11–12, Nov.-Dec. 1978
[17] Electroless Deposit of Cuprous Oxide
   Greenberg and Greininger
   J. Electrochem. Soc.: Electrochemical Science and Technology
   pages 1681–1785, Vol. 124, No. 11, Nov. 1977
[18] A Copper Mirror: Electroless Plating of Copper
   Hill, Foss and Scott
   University of Wisconsin, River Falls, WI, 54022
   Journal of Chemical Education
   Page 752, Vol., 19,
[19] Comparison of Stannous and Stannic Chloride as Sensitizing Agents in the Electroless of Silver on Glass Using X-Ray Photoelectron Spectroscopy
   Pederson, L. R.
   Solar Energy Materials
   Pages 221–232, 6, 1982
   North Holland Publishing Company
[20] Electroless Gold Plating-Current Status
   Yutaka Okinaka
   Abstract No. 441
   Bell Communications Research, Inc.
   600 Mountain Avenue
   Murray Hill, N.J., 07974
[21] AutoCatalytic Deposition of Gold and Tin
   A. Molenaar
   Abstract No. 442
   Philips Research Laboratories
   5600 J A Eindhoven
   The Netherlands
[22] Anodic Oxidation of Reductants in Electroless Plating
   Ono and Haruyama
   Abstract No. 444
   Tokyo Institute of Technology
   Graduate School at Nagatsuta
   Midori ku, Yokahama 27, Japan
[23] Application of Mixed Potential Theory and the Interdependence of Partial Reactions in Electroless Copper Deposition
   Bindra David and Roldan
   Abstract No. 445
   IBM Thomas J. Watson Research Center
   P. O. Box 218
   Yorktown Heights, N.Y., 10598
[24] Transparent Plastic Articles having Ammonium Sulphonic Acid Groups on the Surface thereof and Methods for their Production
   U.S. Pat. No. 3,625,751
   Issued Dec. 7, 1971
   Wilhelm E. Walles
[25] Barrier Plastic Articles
   U.S. Pat. No. 3,916,048
   Issued Oct. 28, 1975
   Wilhelm E. Walles
[26] Laser and Electron Beam Processing of Materials
   Edited by C. W. White
   Solid State Division
   Oak Ridge National Laboratory
   Oak Ridge, Tenn.
   P. S. Peercy
   Division 5112
   Sandia Laboratories
   Alberquerque, New Mexico
   Academic Press, New York, N.Y., 1980
     Pages 18–19: Fundamental Mechanisms
     Pages 65–69: Melting by Pulsed Laser Irradiation
     Pages 671–677: Laser Induced Photochemical Reaction for Electronic Device Fabrication
     Pages 691–699: Metastable Surface Alloys
     Page 697: Crystallization of Copper from the melt using electron beam
[28] Fine Focussed Ion Beam System using Liquid Metal Alloy Ion Sources and Maskless Fabrication
   Gamo, Inomoto, Ochiai and Namba
   Faculty of Engineering Science
   Osaka University
   Toyonaka, Osaka 560, Japan
   Pages 422–433
[29] Microscopy and Lithography with Liquid Metal Ion Sources
   Cleaver, J. R. A.
   Department of Engineering
   Cambridge University,
   England
   Pages 461–466
   Insti. Phys. Conf. Ser. No. 68: Chapter 12
   EMAG, Guildford, 30 August–2 September 1983
[30] Electrohydrodynamic Ion Source
   Mahoney, Yahiku, Daley, Moore and Perel
   Pages 5101–5106
   Journal of Applied Physics
   Vol. 40, No. 13, December 1969
[31] Stable and Metastable Metal Surfaces
   Spencer M. S.
   Pages 685–687
   Nature Vol. 323, 23 October 1986
[32] Electrons in Silicon Microstructures
   Howard, Jackel, Mankiewich, and Skocpol
   Pages 346–349
   Science Vol. 231, 24 January 1986
[33] Atomic-Resolution of TEM Images of Surfaces
   Robinson, Arthur L.
   Pages 304–306
   Science Vol. 230, 18 October 1985
[34] Time-Resolved Electron Energy Loss Spectroscopy
   Ellis, Dubois, Kevin and Cardillo
   Pages 256-26
   Science, Vol. 230, 18 October 1985
[35] Optical Holography
   Collier, Burckhardt and Lin
   Bell Telephone Laboratories
   Pages 300–301
   Academic Press, New York, N.Y., 1971

Having fully described my invention, what I now wish to claim is:

1. In a submicron beam writer for the simultaneous inscription of multiple patterns onto a substrate surface, a first cylinder having an OZ axis in an OXYZ coordinate system, first and second planes normal to said axis at the ends of said cylinder spaced a distance D apart, a vacuum in said first cylinder, a plurality of emitters in an array at said first plane, a third plane between said first and second planes, said third plane being spaced a small distance $D_o$ from said first plane and parallel thereto, a plurality of first anodes in said third plane, each said first anode being concentric with a said emitter, a substrate sheet having an Area $A_1$, a surface on said substrate sheet, said surface being coincident with said second plane, an electric power source of voltage $V_1$, said voltage $V_1$ being applied between said emitters and said first anodes causing the emission of an electron beam from each said emitter, a second anode, an electric power source of high voltage $V_o$ applied between said emitters and said second anode, an electron optics lens, said lens projecting a demagnified image of said emitter array onto said substrate surface, main scanning means, subsidiary scanning means, said main scanning means causing a stop-go scanning motion of said demagnified image over said substrate surface, an Area $A_3$ surrounding each said emitter image, each said emitter image comprising a pixel, said subsidiary scanning means simultaneously scanning each of said pixels over their corresponding Areas $A_3$ during the "stop" portions of the said main scan on said substrate surface, and blanking said images during said "go" portions of the said main scan, a microprocessor, a program, a pattern modulation voltage $V_2$ output from said microprocessor, said program controlling said voltage $V_2$, an amplifier, said voltage $V_2$ being applied to said amplifier, said voltage $V_1$ being modulated by said voltage $V_2$ during the "stop" portions of said main scan, said electron beams modifying the surface properties of the said surface, whereby a plurality of said patterns are inscribed on said substrate surface as variations in said properties.

2. In a submicron beam writer for the simultaneous inscription of multiple patterns onto a substrate surface according to claim 1, a second cylinder along the OX axis, said second cylinder forming a vacuum-tight T-joint with said first cylinder at the origin of the said OXYZ coordinate system, fourth and fifth planes normal to the said OX axis at the ends of said second cylinder, entrance and exit airlocks respectively at said fourth and fifth planes, a plurality of stations along said OX axis for said substrate sheets exterior to, and within said second cylinder between said air locks, a production line belt to momentarily stop-go at each said station, means for supplying blank said sheets to said belt and means for removing said sheets from said production line, said stations being numbered 1 to J to N, where 1 is said blank sheet supply station, J is the beam writing station, the stations 2 to J−1 include the entrance airlocks, and stations J+1 to N−1 include the exit airlocks, the finished sheet takeoff is at station N, and in which the said stations J−2 to J are used for pretreating the substrate surface, the said stations J+1 to N−1 for depositing, crystallizing, ion and insulating coating said metal pattern.

3. A submicron beam writer for the simultaneous inscription of multiple patterns onto a substrate surface according to claim 2, in which the exit airlock on said production line is located at station K, stations K+1 through M being located on said production line at atmospheric pressure, a third cylinder, the axis of said third cylinder being coincident with said OX axis, stations M+1 through N−1 in said third cylinder, entrance and exit airlocks on said third cylinder to maintain a high vacuum therein, said production line passing through said third cylinder between said stations M+1 to N−1, in which said stations K+1 through M are used for wet processing of said substrate surface at atmospheric pressure to deposit metal onto said inscibed patterns, and said stations M+1 to N−1 are used for metal crystallization, ion and insulation coating in a high vacuum.

4. A submicron beam writer for the simultaneous inscription of multiple patterns onto a substrate surface according to claims 2 or 3, in which said entrance air locks comprise low, medium and high vacuum chambers, and vice versa at said exit airlocks.

5. In a submicron beam writer according to claims 2 or 3, for the manufacture of an asymmetric tunnel junction, said tunnel junction comprising a metal strip having a gap, said metal strips having adjacent first and second faces normal to said substrate surface at said gap, an ion coater comprising a first ion source producing ions of a first kind, and a second ion source producing ions of a second kind, said ion sources being angled to coat said first and second faces with said first and second ions, respectively, said ions of said first and second kinds comprising materials having different work functions $\phi_1$ and $\phi_2$ respectively.

6. A submicron beam writer for the simultaneous inscription of multiple patterns onto a substrate surface according to claim 1, in which said electron optic lens comprises a permanent magnet concentric with said OZ axis.

7. A submicron beam writer for the simultaneous inscription of multiple patterns onto a substrate surface according to claim 1, in which said electron optic lens comprises an electromagnet concentric with said OZ axis.

8. In a submicron beam writer for the simultaneous inscription of multiple patterns onto a substrate surface according to claim 7, an amplifier, an electric power source supplying current to said amplifier, a control signal to said amplifier from said microprocessor, current from said amplifier being modulated by said control signal and supplied to said electromagnet, whereby the focal length of the said electron beam is adjusted to focus onto the said said surface of said substrate sheet during the scanning thereof.

9. A submicron beam writer for the simultaneous inscription of multiple patterns onto a substrate surface according to claim 1, in which said electron optic lens comprises an electrostatic Einzel Lens concentric with said OZ axis.

10. In a submicron beam writer for the simultaneous inscription of multiple patterns onto a substrate surface according to claim 9, an amplifier, an electric power source connected to said amplifier, a control signal to said amplifier from said microprocessor, voltage from said amplifier being modulated by said control signal and supplied to said electrostatic Einzel lens, whereby the focal length of the said electron beam is adjusted to focus onto the said said surface of said substrate sheet during the scanning thereof.

11. A submicron beam writer for the simultaneous inscription of multiple patterns onto a substrate surface according to claim 1, in which said main scan means comprises a pair of spaced X-scan electrodes normal to said OX axis, and a pair of Y-scan electrodes normal to the OY axis, said electrodes being equidistant from said OZ axis, a stop-go main X-scan voltage wave and a step-main Y scan voltage wave, said voltage waves being applied respectively to said X-scan electrodes, and said Y scan electrodes, whereby said demagnified image of said emitter array is scanned over said surface in a stop-go motion.

12. A submicron beam writer for the simultaneous inscription of multiple patterns onto a substrate surface according to claim 11, in which said subsidiary scan means comprises said pair of spaced X-scan electrodes normal to said OX axis, and said pair of Y-scan electrodes normal to the OY axis, said electrodes being equidistant from said OZ axis, a subsidiary X-scan voltage wave, and a subsidiary Y scan voltage wave, said subsidiary voltage waves being superimposed on said main scan waves and applied respectively to said X-scan electrodes, and said Y scan electrodes, a subsidiary area $A_3$ surrounding each said demagnified image of each said emitter, said subsidiary scan waves being applied to said electrodes during the stop portions of the main scan, each emitter image being scanned over its corresponding subsidiary area $A_3$ during said stop portion of said main scan.

13. In a submicron beam writer for the simultaneous inscription of multiple patterns onto a substrate surface according to claim 1, means for maintaining said electron beam substantially focussed onto the surface of the said substrate sheet during the said scanning thereof.

14. A submicron electron beam writer according to claim 1 in which said plurality of emitters and first anodes comprises a Spindt-Type Emitter Array.

15. A submicron electron beam writer according to claim 1 in which said electron beam modulation signal $V_1$ is applied between said emitters and said first anodes.

16. In a submicron beam writer according to claim 1 means for applying submicron metal strips, an apparatus for heating and cooling said metal strips to convert said metal strips to single crystals, said apparatus being located in a position on said production line after said metal strips are deposited.

* * * * *